United States Patent
Mayama et al.

(10) Patent No.: US 6,322,060 B1
(45) Date of Patent: *Nov. 27, 2001

(54) ANTI-VIBRATION APPARATUS, EXPOSURE APPARATUS USING THE SAME, DEVICE MANUFACTURING METHOD, AND ANTI-VIBRATION METHOD

(75) Inventors: Takehiko Mayama; Yukio Takabayashi; Shinji Wakui, all of Utsunomiya (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/286,438

(22) Filed: Apr. 6, 1999

(30) Foreign Application Priority Data

Apr. 8, 1998 (JP) .................................................. 10-095893

(51) Int. Cl.[7] .......................... F16M 13/00; F16F 15/02; G03F 7/20; H01L 21/027
(52) U.S. Cl. .......................... 267/136; 378/210; 188/378; 248/550
(58) Field of Search ..................... 188/378–380; 267/136; 248/550, 638; 355/72, 53, 77, 67; 700/280; 702/56; 318/611, 649, 651; 52/663, 664, 666, 665; 414/676; 378/34, 210

(56) References Cited

U.S. PATENT DOCUMENTS

| 5,168,512 | * | 12/1992 | Iwamoto et al. ...................... 378/210 |
| 5,172,160 |   | 12/1992 | Van Eijk et al. ........................ 355/53 |
| 5,187,519 |   | 2/1993  | Takabayashi et al. ................... 355/53 |
| 5,285,995 |   | 2/1994  | Gonzalez et al. ..................... 248/550 |
| 5,504,407 |   | 4/1996  | Wakui et al. .................... 318/568.17 |
| 5,511,930 |   | 4/1996  | Sato et al. ............................ 414/676 |
| 5,568,032 |   | 10/1996 | Wakui .................................. 318/632 |
| 5,653,317 |   | 8/1997  | Wakui .................................. 188/378 |
| 5,812,420 | * | 9/1998  | Takahashi ............................ 248/550 |
| 5,812,958 |   | 9/1998  | Mayama ............................... 701/111 |
| 5,900,707 |   | 5/1999  | Wakui .................................. 318/625 |
| 6,021,991 | * | 2/2000  | Mayama et al. ...................... 248/550 |
| 6,128,552 | * | 10/2000 | Iwai et al. ............................ 700/280 |

FOREIGN PATENT DOCUMENTS 10-089403   4/1998   (JP) .

* cited by examiner

Primary Examiner—Douglas C. Butler
(74) Attorney, Agent, or Firm—Fitzpatrick, Cella, Harper & Scinto

(57) ABSTRACT

An anti-vibration apparatus for actively damping vibrations of an object by generating control forces for reducing the vibrations includes a first actuator for generating a first control force, and a second actuator which generates a second control force and is driven on a driving principle different from that for the first actuator. The first actuator generates forces in the vertical and horizontal directions. The second actuator generates a force in at least one of the vertical and horizontal directions.

44 Claims, 13 Drawing Sheets

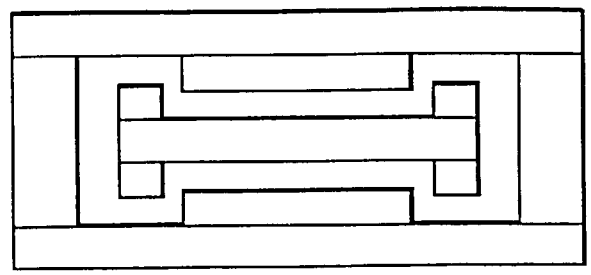
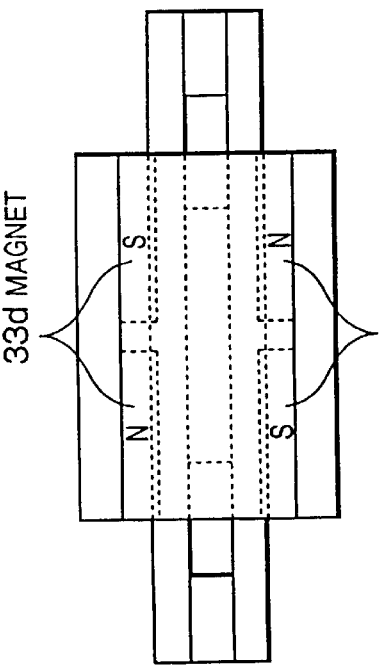
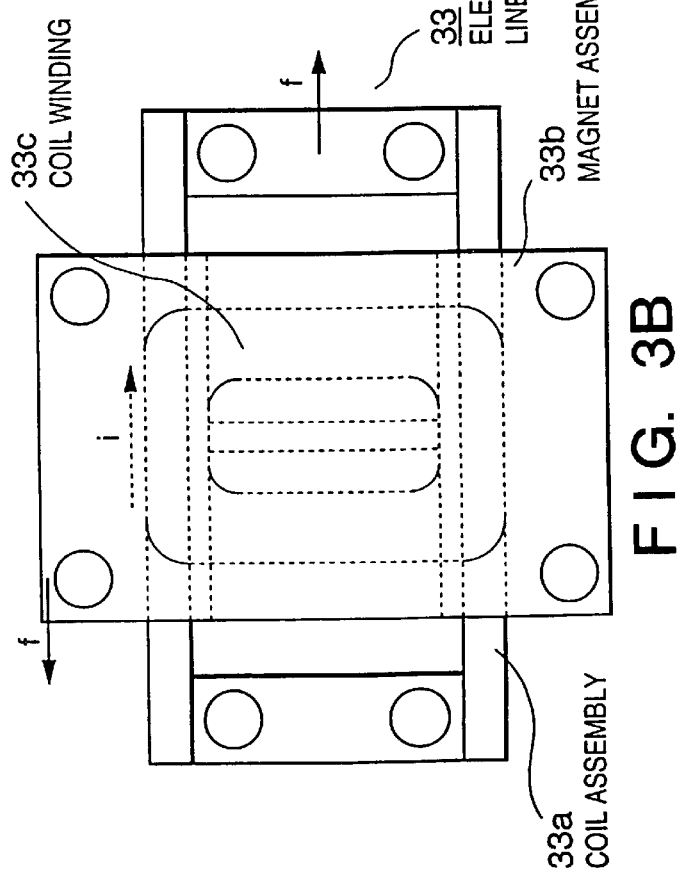

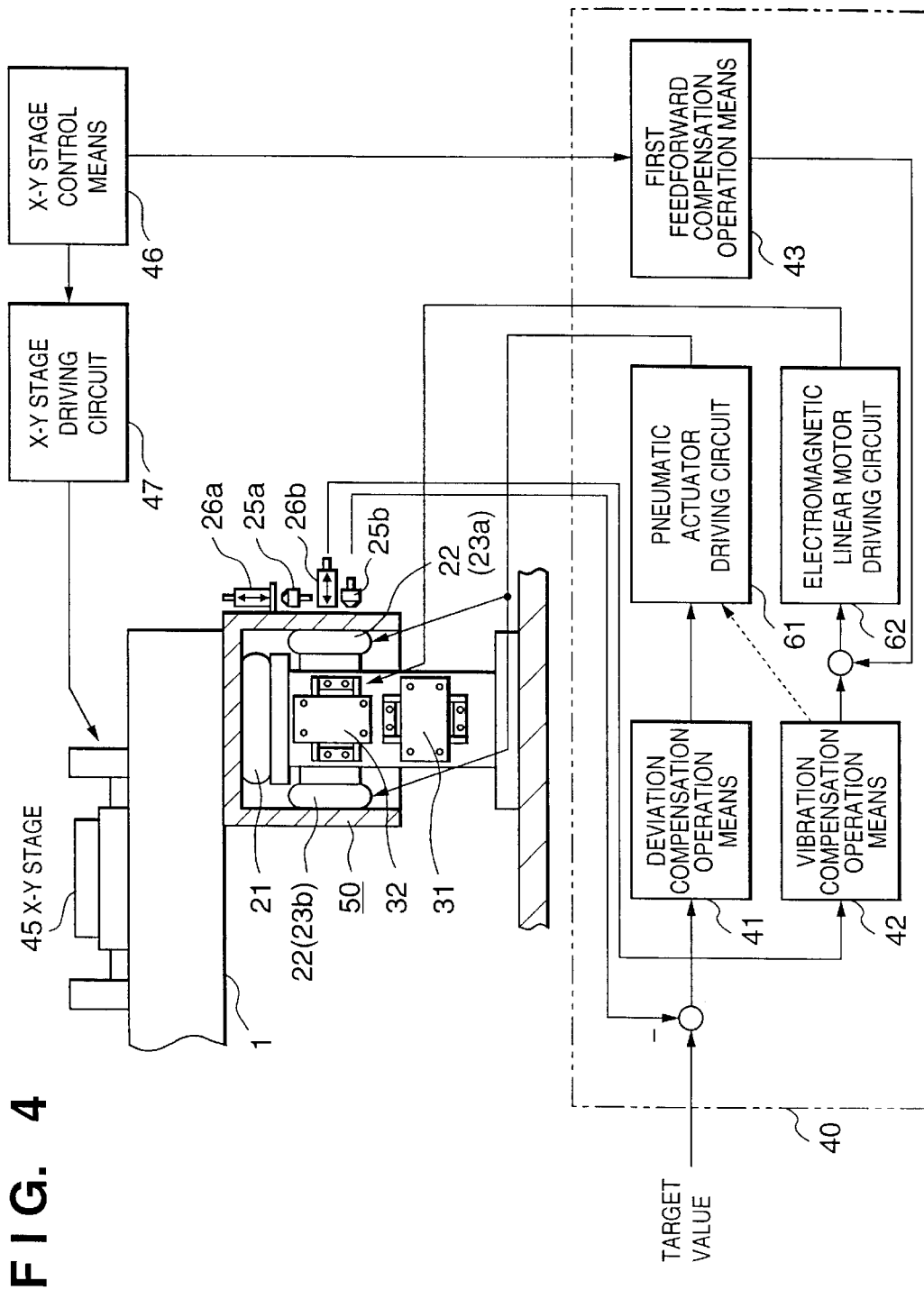

F I G. 9A
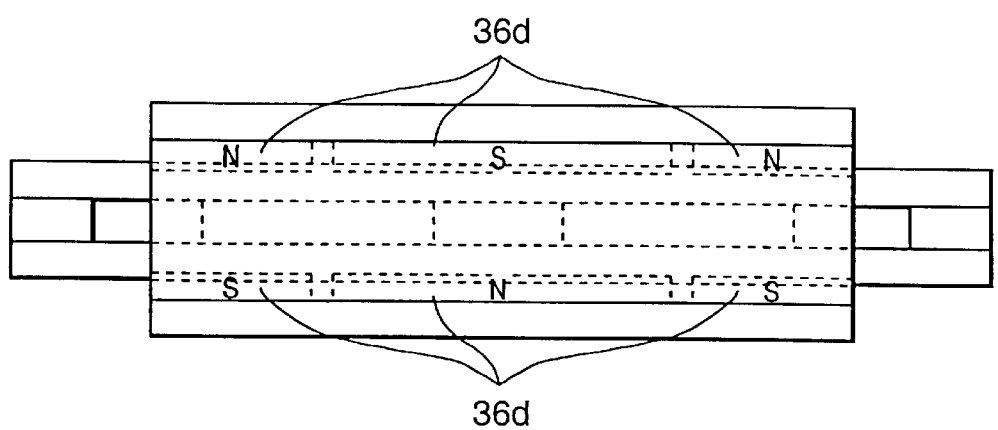
F I G. 9B
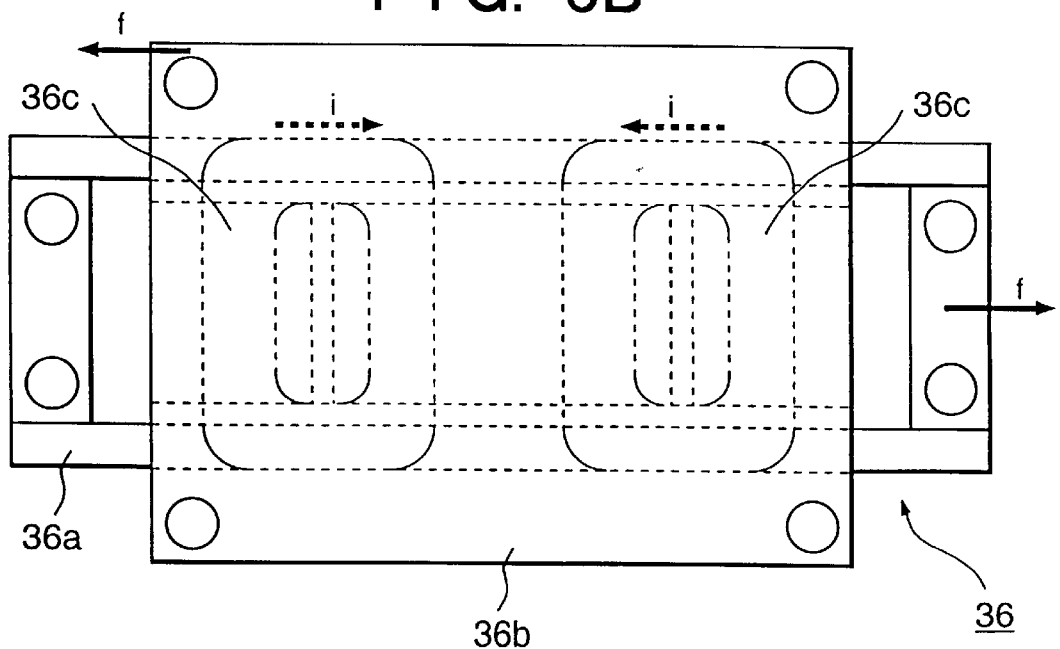

ANTI-VIBRATION APPARATUS, EXPOSURE APPARATUS USING THE SAME, DEVICE MANUFACTURING METHOD, AND ANTI-VIBRATION METHOD

BACKGROUND OF THE INVENTION

Field of the Invention

The present invention relates to an anti-vibration apparatus on which an object to be vibration-damped and isolated from vibrations is mounted and, more particularly, to an active anti-vibration apparatus used in precision equipment such as a semiconductor exposure apparatus having a moving mechanism, e.g., an X-Y stage. The present invention also relates to an exposure apparatus having this anti-vibration apparatus and a device manufacturing method using the exposure apparatus. In addition, the present invention relates to anti-vibration method of mounting an object to be vibration-damped and isolated from vibrations.

With improvements in the preciseness of precision equipment such as an electron microscope and a semiconductor exposure apparatus, enhancement of performance of precision anti-vibration apparatuses that mount them has been demanded. In a semiconductor exposure apparatus, in particular, an anti-vibration table from which external vibrations from a pedestal, (apparatus installation pedestal) such as a floor which the apparatus is mounted, are removed as much as possible, is required to realize proper and quick exposure. This is because vibrations that adversely affect exposure must be prevented from being produced in the exposure stage.

In a semiconductor exposure apparatus characterized by intermittent motions, such as step & repeat motions, the repetitive step operation of the X-Y stage induces vibrations of the anti-vibration table. This is because a driving reaction force of the X-Y stage and the load movement of the X-Y stage induce vibrations of the anti-vibration table. The anti-vibration table is, therefore, required to have an anti-vibration function against external vibrations from a pedestal such as a floor on which the apparatus is installed and a vibration control function against vibrations caused by the motions of the equipment mounted on the anti-vibration table.

Some semiconductor exposure apparatuses use the scan exposure scheme instead of the step & repeat scheme. In such an apparatus as well, externally transmitted vibrations such as vibrations from the apparatus installation pedestal must be removed as much as possible, and vibrations of the anti-vibration table which are induced by the scanning operation of the exposure stage must be instantaneously damped. In a scan exposure apparatus, in particular, since exposure is performed while the exposure stage is performing a scanning operation, both the anti-vibration function against external vibrations and the vibration control function against vibrations caused by the motions of the equipment mounted on the anti-vibration table must meet strict requirements. An anti-vibration apparatus with higher performance becomes indispensable.

To meet such requirements, an active anti-vibration apparatus has recently been put into practice, which detects vibrations of an anti-vibration table through a sensor, and compensates for the output signal from the sensor to feed back the resultant signal to an actuator for applying a control force to the anti-vibration table, thereby actively controlling the vibrations of the anti-vibration table. An active anti-vibration apparatus can realize an anti-vibration apparatus having the anti-vibration function and the vibration control function with a good balance, which is difficult for a passive anti-vibration apparatus comprised of springs, dampers, and the like to realize.

As an actuator for applying a control force to an anti-vibration table, a conventional active anti-vibration apparatus generally uses a pneumatic actuator for actively controlling a thrust to be generated by adjusting the internal pressure of a pneumatic spring.

In an anti-vibration apparatus that mounts precision equipment, to maximize the anti-vibration function by minimizing the natural frequency of a vibration system constituted by an anti-vibration table and a support mechanism for damping/supporting the anti-vibration table, it is effective to increase the weight of the anti-vibration table and use pneumatic springs, having a small spring constant, for the support mechanism of the anti-vibration table. In addition, the pneumatic springs can easily generate large thrusts by increasing their pressure-receiving areas, and hence, can be suitably used as a support mechanism for supporting a heavy anti-vibration table. If, therefore, a pneumatic actuator is used as an actuator for applying a control force to an anti-vibration table, an anti-vibration apparatus having a relatively simple structure can be realized because the actuator can also serve as a damper support mechanism for the anti-vibration table.

When, however, a device having a driving means such as an X-Y stage is mounted on an anti-vibration table, as in a semiconductor exposure apparatus, the required vibration suppressing effect cannot always be obtained by an active anti-vibration apparatus using a pneumatic actuator.

In general, an X-Y stage has a mechanism for driving a ball screw by using an electromagnetic motor or a structure of linearly driving the stage by using an electromagnetic linear motor or the like. That is, the X-Y stage is driven by using an electromagnetic actuator exhibiting fast-response characteristics with respect to a driving force command signal. In contrast to this, the response of the pneumatic actuator to a driving force command signal is slower than that of the electromagnetic actuator. In general, the response frequency of the pneumatic actuator is lower than that of the electromagnetic actuator by 100 times or more. For this reason, the active anti-vibration apparatus using the pneumatic actuator cannot generate a control force corresponding to a driving reaction force of the X-Y stage driven by the electromagnetic actuator at a satisfactory response speed, thus failing to obtain a sufficient vibration suppressing effect.

In order to solve such a problem, an electromagnetic actuator may be used as an actuator for applying a control force to an anti-vibration table. For example, as such an apparatus, an anti-vibration apparatus designed to magnetically float the anti-vibration table by using the attraction force of an electromagnet is available. As described above, however, the anti-vibration table that mounts precision equipment is very heavy, and hence, very high energy must be applied to the apparatus to support/drive the anti-vibration table with an electromagnetic force. In the electromagnetic actuator, in particular, heat is generated by coil windings used to generate an electromagnetic force. If, therefore, the actuator is driven by applying high energy, a large quantity of heat is generated. But, precision equipment including a semiconductor exposure apparatus and the like is greatly influenced by changes in temperature; the apparatus performance is seriously affected even by a 1° C. rise in apparatus temperature. Therefore, it is unfavorable if the electromagnetic actuator produces a large amount of heat.

As higher preciseness and throughput are required for semiconductor exposure apparatuses, there are great demands for an active anti-vibration apparatus that can support a heavy anti-vibration table and equipment mounted thereon and generate a control force in quick response to a driving reaction force of a device such as an X-Y stage which is driven on the anti-vibration table at high speed. Such requirements have become stricter in the field of next-generation semiconductor exposure apparatuses and the like, in which it is expected that a driving reaction force of an X-Y stage will increase with an increase in driving speed.

When vibrations produced by such a driving reaction force are to be damped and controlled by using an anti-vibration apparatus, damping and vibration control operation must be performed not only in the vertical direction but also in the horizontal direction. In a semiconductor exposure apparatus or the like, importance is often attached to the integration of an anti-vibration apparatus as a unit. In addition, it is difficult for a conventional anti-vibration apparatus using an air cylinder to perform damping and vibration control in both the vertical and horizontal directions. To realize this, the apparatus inevitably increases in complexity. Demands have, therefore, arisen for an anti-vibration apparatus that is made up of more compact components and appropriately integrated with an exposure apparatus with the components being efficiently arranged.

SUMMARY OF THE INVENTION

It is an object of the present invention to provide an active anti-vibration apparatus which has a compact structure, satisfies the above requirements, maximizes the characteristics of a pneumatic actuator capable of steadily generating a large thrust and an electromagnetic actuator having fast-response characteristics, and minimizes the influences of heat on the device such as a semiconductor exposure apparatus mounted on an anti-vibration table, an exposure apparatus using this active anti-vibration apparatus, a device manufacturing method using the exposure apparatus, and an anti-vibration method.

In order to achieve the above object, according to the present invention, there is provided an anti-vibration apparatus for actively damping vibrations of an object by generating control forces to reduce the vibrations, comprising a first actuator for generating a first control force, and a second actuator for generating a second control force, the second actuator using a driving principle different from that of the first actuator, wherein the first actuator generates forces in vertical and horizontal directions, and the second actuator generates a force at least in one of the vertical and horizontal directions.

According to this anti-vibration apparatus, vibrations of an object can be actively reduced by generating the forces in the vertical and horizontal directions, and the respective components are made more compact and efficiently arranged to realize a compact anti-vibration apparatus.

There is provided an exposure apparatus comprising anti-vibration means using the above anti-vibration apparatus.

Since vibrations of the components of the exposure apparatus are accurately damped, the exposure apparatus can perform high-speed, high-precision exposure.

There is provided a method of manufacturing a device by using the above exposure apparatus, comprising the steps of providing the above, and transferring a pattern formed on a reticle onto a wafer.

A device can be manufactured at high speed with high precision by this device manufacturing method.

There is provided an anti-vibration method comprising the steps of detecting a displacement or vibration of a damped/supported object, extracting signals representing motion modes of translation and rotation from the detection values, performing a compensation operation on the basis of the signals, and controlling, based on the compensation operation, at least one of a first actuator for generating forces in vertical and horizontal directions and a second actuator which generates a force in at least one of the vertical and horizontal directions and is driven on a driving principle different from a driving principle of the first actuator.

According to this anti-vibration method, vibrations of a damped/supported object can be accurately damped in the vertical and horizontal directions.

There is provided an anti-vibration method comprising the steps of performing a feedforward compensation operation on the basis of the state of the device mounted on an anti-vibration apparatus or a signal from the device and controlling, based on the compensation operation, at least one of a first actuator for generating forces in vertical and horizontal directions and a second actuator which generates a force in at least one of the vertical and horizontal directions and is driven by a driving principle different from a driving principle of the first actuator.

According to this anti-vibration method, vibrations of a device mounted on the anti-vibration apparatus can be accurately damped in the vertical and horizontal directions by feedforward compensation.

According to a preferred aspect of the present invention, the first actuator of the anti-vibration apparatus has one of a pneumatic actuator and an electromagnetic linear motor, and the second actuator has the other of the pneumatic actuator and the electromagnetic linear motor.

According to this anti-vibration apparatus, a large thrust can steadily be generated by using the pneumatic actuator with almost no heat generated. In addition, vibrations can be damped at a high response speed by using the electromagnetic linear motor in combination with the pneumatic actuator.

According to another preferred aspect of the present invention, the first actuator of the anti-vibration apparatus includes two actuators for generating forces in the vertical and horizontal directions.

According to still another preferred aspect of the present invention, the second actuator of the anti-vibration apparatus includes two actuators for generating forces in the vertical and horizontal directions.

According to still another preferred aspect of the present invention, the actuator of the anti-vibration apparatus which generates the force in the horizontal direction has the opposing pneumatic actuator.

According to this anti-vibration apparatus, a large thrust can be generated in the horizontal direction and a displacement can be provided by using the opposing pneumatic actuator.

According to still another preferred aspect of the present invention, the actuator of the anti-vibration apparatus which generates a force in the horizontal direction has the pneumatic actuator and a pre-pressurizing mechanism.

According to this anti-vibration apparatus, by using the pneumatic actuator and the pre-pressurizing mechanism, a large thrust and displacement can be provided in the horizontal direction, and control of an air pressure and piping can be facilitated.

According to still another preferred aspect of the present invention, in the anti-vibration apparatus, the axis of action of the first actuator for generating the force in the vertical direction substantially coincides with the axis of action of the second actuator for generating the force in the vertical direction.

According to still another preferred aspect of the present invention, in the anti-vibration apparatus, the axis of action of the first actuator for generating the force in the horizontal direction substantially coincides with the axis of action of the second actuator for generating the force in the horizontal direction.

According to still another preferred aspect of the present invention, in the anti-vibration apparatus, fixation parts of the first and also the second actuators are established as a unit, and mobile parts of the first and also the second actuators are established as a unit.

According to still another preferred aspect of the present invention, in the anti-vibration apparatus, a fixation part of the first actuator for generating a force in a vertical direction and a fixation part of the first actuator for generating a force in a horizontal direction are established as a unit, and a mobile part of the first actuator for generating a force in a vertical direction and a mobile part of the first actuator for generating a force in a horizontal direction are established as a unit.

According to still another preferred aspect of the present invention, the anti-vibration apparatus comprises at least one of passive elastic support means and passive vibration damping means.

According to still another preferred aspect of the present invention, the anti-vibration apparatus further comprises displacement detection means for detecting a displacement of a control target.

According to this anti-vibration apparatus, a displacement can be detected by the displacement detection means.

According to still another preferred aspect of the present invention, the anti-vibration apparatus comprises vibration detection means for detecting vibrations of a control target.

According to this anti-vibration apparatus, vibrations can be detected by the vibration detection means.

According to still another preferred aspect of the present invention, the vibration detection means of the anti-vibration apparatus is an acceleration sensor.

According to still another preferred aspect of the present invention, the vibration detection means of the anti-vibration apparatus is a velocity sensor.

According to still another preferred aspect of the present invention, the anti-vibration apparatus drives the first or second actuator on the basis of at least one of output signals from the displacement detection means and the vibration detection means.

According to this anti-vibration apparatus, a displacement or vibration is detected, and forces are generated by the first and second actuators on the basis of the detection value, thereby accurately damping vibrations in the vertical and horizontal directions with a compact structure.

According to still another preferred aspect of the present invention, the output signal from the displacement detection means of the anti-vibration apparatus is compensated for and fed back to the pneumatic actuator.

According to still another preferred aspect, the output signal from the vibration detection means of the anti-vibration apparatus is compensated for and fed back to the electromagnetic linear motor.

According to still another preferred aspect of the present invention, the pneumatic actuator of the anti-vibration apparatus has a dead zone in a direction perpendicular to the direction in which the force is generated.

According to this anti-vibration apparatus, since each pneumatic actuator has a backlash in a direction perpendicular to the direction in which a force is generated, the pneumatic actuators in the vertical and horizontal directions do not interfere with each other, and vibrations in the two directions can be damped.

According to still another preferred aspect of the present invention, the pneumatic actuator of the anti-vibration apparatus has a bellows structure.

According to this anti-vibration apparatus, since each pneumatic actuator is formed by using a bellows structure, a compact anti-vibration apparatus with a high degree of integration can be provided.

According to still another aspect of the present invention, the pneumatic actuator of the anti-vibration apparatus has a pressure control valve for adjusting the internal pressure of the pneumatic actuator or a flow rate valve for adjusting the flow rate of air supplied/exhausted.

According to still another preferred aspect of the present invention, the pneumatic actuator of the anti-vibration apparatus comprises a pressure sensor for detecting the internal pressure of the pneumatic actuator, and has a pressure control loop for actuating at least one of the pressure control valve and the flow rate control valve on the basis of a compensation signal obtained from the pressure compensation means.

According to still another preferred aspect of the present invention, the electromagnetic linear motor of the anti-vibration apparatus is a moving magnet type linear motor.

According to this anti-vibration apparatus, the influences of heat on an object whose vibrations must be damped can be reduced, and wiring of the coil winding can be facilitated.

According to still another preferred aspect of the present invention, the electromagnetic linear motor of the anti-vibration apparatus has a structure in which a coil is placed in a magnetic field between a plurality of opposing magnets.

According to still another preferred aspect of the present invention, the electromagnetic linear motor of the anti-vibration apparatus is a single-phase linear motor having one coil.

According to still another preferred aspect of the present invention, the electromagnetic linear motor of the anti-vibration apparatus is a polyphase linear motor having a plurality of coils.

According to still another preferred aspect of the present invention, each of the plurality of coils of the anti-vibration apparatus is energized in a direction opposite to a direction in which a current flows in a corresponding adjacent coil.

According to this anti-vibration apparatus, undesired thrust components produced in each electromagnetic linear motor can be easily reduced, and a high-precision anti-vibration apparatus can be provided by using high-precision, low-cost electromagnetic linear motors.

According to still another preferred aspect of the present invention, the electromagnetic linear motor of the anti-vibration apparatus comprises an interpole magnet.

According to this anti-vibration apparatus, the magnetic flux generated by each electromagnetic linear motor can be made uniform and strong, and the thrust generated by each electromagnetic linear motor can be increased, thereby realizing a high-precision anti-vibration apparatus.

According to still another preferred aspect of the present invention, each of the first and second actuators of the anti-vibration apparatus comprises a plurality of actuators.

According to this anti-vibration apparatus, vibrations in motion modes of translation and rotation can be damped and controlled by arranging a plurality of first and second actuators.

According to still another preferred aspect of the present invention, the plurality of electromagnetic linear motors or coils of the electromagnetic linear motors arranged in the anti-vibration apparatus are formed into several groups, and a plurality of electromagnetic linear motors or coils of the electromagnetic linear motors which are included in the same group are driven by the same driving signal.

According to still another preferred aspect of the present invention, the electromagnetic linear motors or coils of the electromagnetic linear motors of the anti-vibration apparatus which are driven by the same driving signal are electrically connected in series or parallel.

According to this anti-activation apparatus, signals and wiring of the control system of the anti-vibration apparatus can be simplified, and a reduction in cost can be achieved.

According to still another preferred aspect of the present invention, in the anti-vibration apparatus, signals representing motion modes of translation and rotation are extracted from adisplacement target value and output signals from the plurality of displacement detection means, and the extracted signals are compensated for to drive at least one of sets of the first actuators and the second actuators.

According to still another preferred aspect of the present invention, the anti-vibration apparatus extracts signals representing motion modes of translation and rotation from output signals from the plurality of vibration detection means, and compensates for the extracted signals to drive at least one of sets of the first actuators and the second actuators.

According to still another preferred aspect of the present invention, the anti-vibration apparatus further comprises first feedforward compensation operation means for performing a compensation operation on the basis of a state of a device mounted on the anti-vibration apparatus or a signal from the device, and drives the first actuator on the basis of a compensated signal obtained by a first feedforward compensation operation.

According to still another preferred aspect of the present invention, the anti-vibration apparatus further comprises second feedforward compensation operation means for performing a compensation operation on the basis of a state of a device mounted on the anti-vibration apparatus or a signal from the device, and drives the second actuator on the basis of a compensated signal obtained by the second feedforward compensation operation means.

This anti-vibration apparatus can damp vibrations of a mounted device by feedforward compensation.

According to still another preferred aspect of the present invention, the anti-vibration means of the exposure apparatus supports a stage base plate and removes vibrations of the stage base plate.

According to still another preferred aspect of the present invention, the anti-vibration means of the exposure apparatus supports a lens barrel base plate and removes vibrations of the lens barrel base plate.

According to still another preferred aspect of the present invention, a reticle base plate for supporting a reticle stage of the exposure apparatus is coupled to a lens barrel base plate, and the anti-vibration means supports the lens barrel base plate and removes vibrations of the reticle stage.

According to still another preferred aspect of the present invention, the exposure apparatus is a scan type exposure apparatus.

According to still another preferred aspect of the present invention, the device manufacturing method further comprises the steps of developing a portion exposed on the wafer, and cutting a chip formed on the wafer.

A device can be manufactured at high speed with high precision by this device manufacturing method.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 3A, 3B and 3C are schematic views showing an electromagnetic linear motor used in the anti-vibration apparatus of the first embodiment;

FIG. 4 is a schematic view showing the control system of the anti-vibration apparatus of the first embodiment which is associated with the horizontal direction;

FIGS. 9A and 9B are schematic views showing an electromagnetic linear motor used in an anti-vibration apparatus according to the fifth embodiment of the present invention;

DETAILED DESCRIPTION OF THE PREFERRED EMBODIMENTS

Preferred embodiments of the present invention will be described in detail in accordance with the accompanying drawings.

First Embodiment

In this embodiment, an anti-vibration unit that supports an anti-vibration table on which precision equipment such as a semiconductor exposure apparatus is mounted, and reduces harmful vibrations that adversely affect the mounted equipment, is disclosed.

Figure 1:
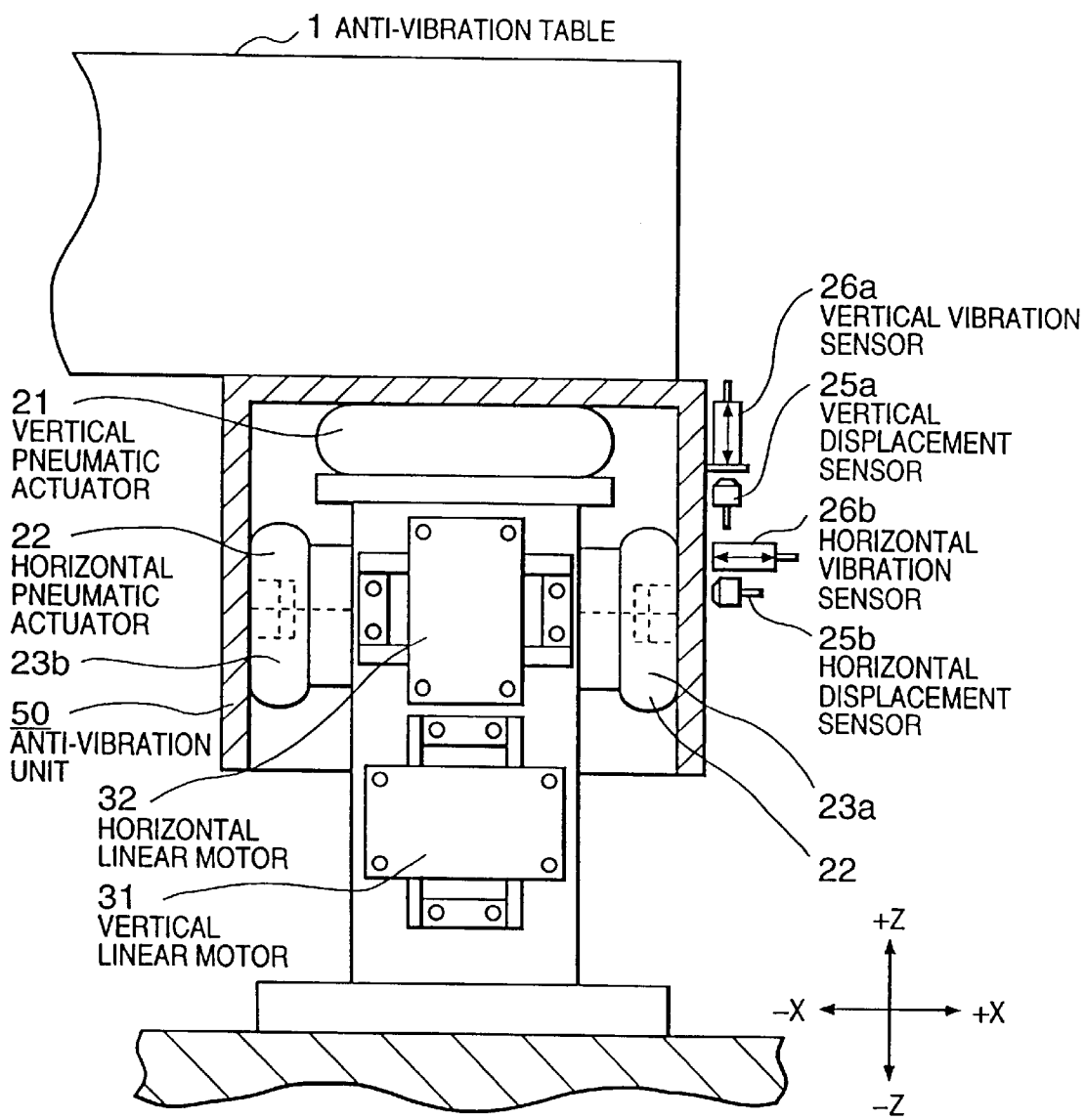
FIG. 1 is a schematic view showing an anti-vibration apparatus according to the first embodiment of the present invention.

FIG. 1 is a schematic view showing an active anti-vibration apparatus according to the first embodiment. This embodiment will be described below with reference to FIG. 1.

An anti-vibration table 1 such as a base plate on which precision equipment such as a semiconductor exposure apparatus is mounted is supported by an anti-vibration unit 50 firmly fastened to the anti-vibration table 1. Reference numeral 21 denotes a vertical pneumatic actuator for applying a control force to the anti-vibration table 1 in the vertical direction (Z direction); 22, a horizontal pneumatic actuator for applying a control force to the anti-vibration table 1 in the horizontal direction (X direction); 31, a vertical linear motor as an electromagnetic actuator for applying a control force to the anti-vibration table 1 in the vertical direction; and 32, a horizontal linear motor as an electromagnetic actuator for applying a control force to the anti-vibration table 1 in the horizontal direction. The anti-vibration unit 50 includes the vertical pneumatic actuator 21, the horizontal pneumatic actuator 22, the vertical linear motor 31, and the horizontal linear motor 32.

The anti-vibration unit 50 also has a vertical vibration sensor 26a and a horizontal vibration sensor 26b which respectively detect vibration signals representing accelerations or velocities of the anti-vibration table 1 or anti-vibration unit 50, which is firmly fastened to the anti-vibration table 1, in the vertical and horizontal directions.

The anti-vibration unit 50 also has a vertical displacement sensor 25a and a horizontal displacement sensor 25b which respectively detect displacement signals to the reference positions.

The anti-vibration unit 50 may include an elastic support means such as a spring mechanism and a passive vibration damping means such as a viscous damper. If a pneumatic actuator, to be described later, is used as an actuator for applying a control force to the anti-vibration table 1, as in the apparatus disclosed in the present invention, the pneumatic actuator can also serve as an elastic support means for supporting the anti-vibration table 1. In addition, according to this apparatus, vibrations of the anti-vibration table 1 can be damped by performing a control operation to be described later. The object of the present invention can, therefore, be satisfactorily achieved by the anti-vibration unit 50 having no passive elastic support means and vibration damping means as shown in FIG. 1.

<Pneumatic Actuator>

The vertical and horizontal pneumatic actuators 21 and 22 are pneumatic actuators for applying control forces to the anti-vibration table 1 and will be described next.

As each of the vertical and horizontal pneumatic actuators 21 and 22, an actuator unit made up of a pneumatic spring and a pressure control valve for continuously adjusting the internal pressure of the pneumatic spring in accordance with an electrical command signal or an actuator unit made up of a pneumatic spring and a flow rate control valve for adjusting the flow rate of air supplied/exhausted to/from the pneumatic spring can be used. As will be described later, these actuators are driven on the basis of the displacement of the anti-vibration table 1 with respect to a reference position or a compensation signal for vibrations of the anti-vibration table 1.

The vertical pneumatic actuator 21 adjusts a pressure control valve or flow rate control valve (not shown) to generate a force in a direction to raise the anti-vibration table 1 by increasing the internal pressure of the pneumatic spring and a force in a direction to lower the anti-vibration table 1 by decreasing the internal pressure of the pneumatic spring. A pneumatic actuator of this type using a pneumatic spring cannot generate any force except for increasing the internal pressure of the pneumatic spring. In the case with the vertical pneumatic actuator 21, however, since the weight of the anti-vibration table 1 is applied as a pre-pressure to the vertical pneumatic actuator 21, a force in a direction to lower the anti-vibration table 1 can be generated by decreasing the internal pressure of the pneumatic spring.

Each pneumatic spring has a rubber bellows structure to ensure a backlash (allowable range of movement) in a direction perpendicular to the direction in which a force is generated. For example, to prevent the horizontal pneumatic actuator from being interfered with with the motions of the vertical pneumatic actuator, the bellows structure is designed to prevent interference between the respective actuators when vibrations in both the vertical and horizontal directions are removed. The structure of each pneumatic spring is not limited to the bellows structure as long as the actuator can move in a direction perpendicular to the direction in which a force is generated. For example, each actuator may have a cylinder mechanism having a compensation mechanism in a direction perpendicular to the direction in which a force is generated.

FIG. 1 shows the first example of the arrangement of the horizontal pneumatic actuator 22 in this embodiment, which includes two opposing pneumatic actuators. In this case, forces in two directions, i.e., the +X direction and the opposite direction, the −X direction, indicated by the arrows in FIG. 1 can be generated for the anti-vibration table 1 by controlling the balance between the forces generated by two pneumatic springs 23a and 23b that are arranged opposite to constitute the horizontal pneumatic actuators 22. More specifically, the pressure control valve or flow rate control valve (not shown) is adjusted to increase the internal pressure of the pneumatic spring 23a and decrease the internal pressure of the pneumatic spring 23b so as to generate a force in the +X direction. In addition, the above valve is adjusted to decrease the internal pressure of the pneumatic spring 23a and increase the internal pressure of the pneumatic spring 23b so as to generate a force in the −X direction.

Referring to FIG. 1, the horizontal pneumatic actuator 22 in the anti-vibration unit 50 corresponds to only one horizontal direction. If, however, two or more horizontal pneumatic actuators are used, control forces can be applied in a plurality of arbitrary directions.

Figure 2:
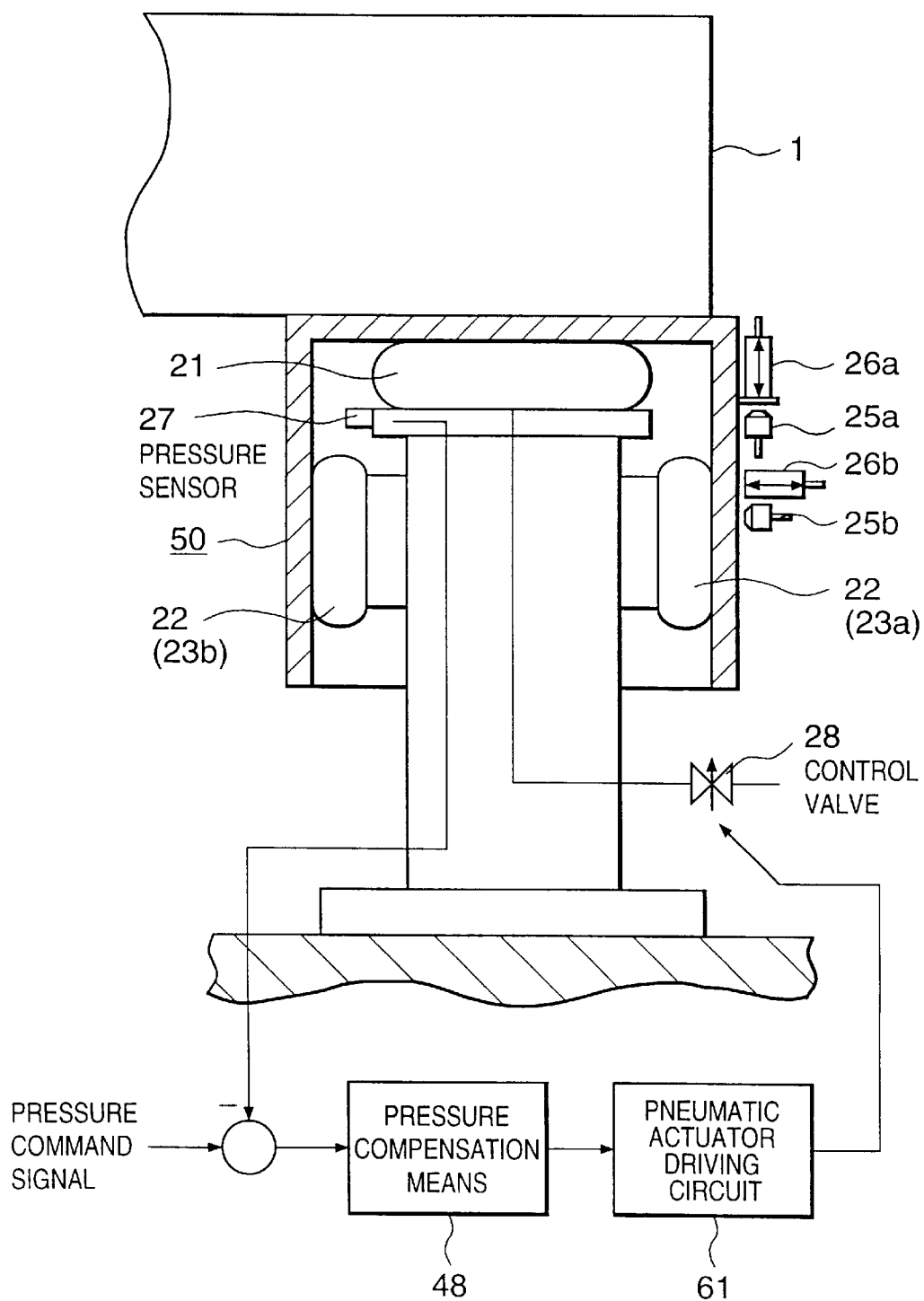
FIG. 2 is a schematic view of the control system of a pneumatic actuator used in the anti-vibration apparatus of the first embodiment.

FIG. 2 is a conception diagram of the control system for the pneumatic actuator.

The pneumatic actuator preferably has a pressure control loop in which the internal pressure of the pneumatic spring is detected by a pressure sensor 27, the difference signal between a pressure command signal and the output signal from the pressure sensor 27 is compensated for by a pressure compensation means 48, and a control valve 28 such as a pressure control valve or flow rate control valve which is driven on the basis of the compensated signal. FIG. 2 schematically shows the control system for the vertical pneumatic actuator having the pressure control loop. In this case, an input signal (driving command signal) to the pneumatic actuator is the pressure command signal shown in FIG. 2.

<Linear motor>

Linear motors used as the vertical linear motor 31 and the horizontal linear motor 32 will be described next.

FIGS. 3A to 3C show three views of an electromagnetic linear motor, which is the first example of an arrangement of an electromagnetic linear motor used as the vertical linear motor 31 or horizontal linear motor 32 in this embodiment.

The electromagnetic linear motor in FIGS. 3A to 3C is a single-phase linear motor 33 made up of a coil assembly 33a including one coil winding 33c and a magnet assembly 33b including two pairs of opposing permanent magnets 33d.

As shown in FIGS. 3A to 3C, the coil assembly 33a is placed in the magnetic circuit formed by the magnet assembly 33b so as not to touch the magnet assembly 33b. As the coil winding 33c, a copper wire or the like with several hundred turns can be used.

As shown in FIGS. 3A to 3C, in the magnet assembly 33b, the two pairs of permanent magnets 33d, which oppose each other through the coil winding 33c, are opposite in polarity and form a magnetic circuit in which the magnetic fluxes formed by the respective pairs of permanent magnets are opposite in direction. That is, as shown in FIGS. 3A to 3C, a pair of permanent magnets having an N-S arrangement is placed opposite to a pair of permanent magnets having an S-N arrangement.

When a current is fed through the coil winding 33c placed in the magnetic field to cross the direction of magnetic fluxes at right angles, a thrust is generated between the coil assembly 33a and the magnet assembly 33b in a direction perpendicular to the direction of magnetic flux and coil current direction. Referring to FIGS. 3A to 3C, when a current is fed through the coil winding 33c in the direction indicated by an arrow i, a thrust proportional to the coil current and the magnetic flux density in the space where the coil winding 33c is present acts on the coil assembly 33a and the magnet assembly 33b in the direction indicated by an arrow f.

This electromagnetic linear motor can, therefore, be used as an actuator for applying a control force to the anti-vibration table 1 by mounting the coil assembly 33a on the apparatus installation pedestal on which this anti-vibration apparatus is installed or a member firmly fastened to the apparatus installation pedestal and also mounting the magnet assembly 33b on the anti-vibration table 1 or a member firmly fastened to the anti-vibration table 1.

An electromagnetic linear motor of this type that uses a Lorentz force has no mechanical interference mechanism between the coil assembly and the magnet assembly, and these assemblies are mechanically isolated from vibrations in a noncontact state. An anti-vibration apparatus is required to minimize transmission of vibrations between two structures, i.e., the anti-vibration table and the apparatus installation pedestal. An electromagnetic linear motor of this type can be suitably used in this field of anti-vibration techniques. In addition, the electromagnetic linear motor having this arrangement can be formed by a flat structure to improve the spatial arrangement efficiency, thereby further facilitating mounting of the electromagnetic linear motor in the anti-vibration unit.

In the anti-vibration apparatus disclosed in the present invention, each electromagnetic linear motor is preferably used as a moving magnet type linear motor obtained by mounting a coil assembly on the apparatus installation pedestal or a member firmly fastened to the apparatus installation pedestal and also mounting a magnet assembly on the anti-vibration table 1 or a member firmly fastened to the anti-vibration table 1. Since the coil winding has an electric resistance, heat is generated when current is fed through it. In consideration of the influence of heat on the preciseness of the precision equipment mounted on the anti-vibration table 1, the magnet assembly is preferably mounted on the anti-vibration table 1 or a member firmly fastened thereto. The coil assembly as a heating element is undesirable for mounting on the anti-vibration table 1 or a member firmly fastened thereto. This arrangement can suppress direct transmission of heat to the precision equipment through the members constituting the anti-vibrationunit. This allows measures to be mainly taken for transmission of heat through the atmosphere in the space where the electromagnetic linear motor is present. In addition, when the coil assembly is mounted on the apparatus installation pedestal or a member firmly fastened to the apparatus installation pedestal, the coil can be located more easily than when the coil is mounted on a movable portion. The transmission of heat through the atmosphere in the space can be easily suppressed by, for example, surrounding the electromagnetic linear motor with a metal member having a large heat capacity and drawing the air in the space.

A plurality of electromagnetic linear motors each identical to the one described above is arranged on each portion of the anti-vibration table 1. These electromagnetic linear motors may be formed into several groups, and a plurality of electromagnetic linear motors included in the same group may be driven by the same driving command signal. In addition, the plurality of electromagnetic linear motors driven by the same driving command signal may be further formed into several groups (at least one group), and a plurality of electromagnetic linear motors included in the same group may electrically be connected in parallel or series to be driven.

It is preferable that the axis of action of each pneumatic actuator almost coincides with that of each electromagnetic linear motor in both the vertical and horizontal directions.

The operation of the anti-vibration unit 50 will be described next.

FIG. 4 schematically shows the control system of the anti-vibration unit 50 in the horizontal direction in this embodiment. The control system in the vertical direction has the same arrangement as that in the horizontal direction.

The anti-vibration unit 50 is operated by driving the vertical pneumatic actuator 21, the horizontal pneumatic actuator 22, the vertical linear motor 31, and the horizontal linear motor 32 on the basis of signals from a vertical displacement sensor 25a, a horizontal displacement sensor 25b, the vertical vibration sensor 26a, the horizontal vibration sensor 26b, and other devices.

As the vertical displacement sensor 25a and the horizontal displacement sensor 25b, oscillation type displacement sensors such as eddy current sensors can be used. As the vertical vibration sensor 26a and the horizontal vibration sensor 26b, acceleration sensors can be used. The sensors are not limited to the displacement sensor, and a vibration sensor and maybe included with the velocity sensor. Especially, it is possible to concomitantly use the velocity sensor and acceleration sensor.

<Displacement Control>

A displacement control operation to be performed on the basis of output signals from the vertical displacement sensor 25a and the horizontal displacement sensor 25b will be described first. In this case, this operation will be referred to as displacement control for the sake of descriptive convenience. The vertical and horizontal displacements of the anti-vibration table 1 or the anti-vibration unit 50 firmly fastened to the anti-vibration table 1 are respectively detected by the vertical displacement sensor 25a and the horizontal displacement sensor 25b. The resultant detection signals are input to a compensation operation means 40 to calculate difference signals between the target values of displacements with respect to the reference position of the anti-vibration table 1 and the output signals from the vertical displacement sensor 25a and the horizontal displacement sensor 25b, i.e., deviation signals with respect to the vertical and horizontal reference positions. The calculated deviation signals are input to a deviation compensation operation means 41 and compensated for. The deviation compensation operation means 41 performs a compensation operation for the deviation signals by a control method such as a PID compensation (proportional/integral/differential compensation) method. In this displacement control operation, in particular, a compensation operation such as PI compensation (proportional/integral compensation) including an integral operation is preferably performed to set the anti-vibration table 1 at a predetermined target position without any deviation. The deviation compensation signals obtained as a result of the above compensation operation are input to the above actuators, i.e., the vertical pneumatic actuator 21 and the horizontal pneumatic actuator 22 or the driving circuits for the vertical linear motor 31 and the horizontal linear motor 32 so as to drive the respective actuators, thereby properly setting the anti-vibration table 1 at the predetermined target position.

Note that in this displacement control operation, a thrust must be steadily applied to the anti-vibration table 1 to keep the anti-vibration table 1 at a predetermined position. In order to keep the anti-vibration table 1 at a predetermined position in the vertical direction, in particular, a thrust large enough to support the anti-vibration table 1 is required for each actuator. The weight of the anti-vibration table 1 must be increased to improve the anti-vibration effect, and a large thrust must steadily be generated to maintain the anti-vibration table 1 at a predetermined position.

However, the electromagnetic linear motors used as the vertical linear motor 31 and the horizontal linear motor 32 generate heat when currents are fed through the coils. When the electromagnetic linear motors are used in a displacement control operation to steadily generate large thrusts, in particular, the amount of heat generated by the coils increases, and the heat is transferred to the anti-vibration unit 50 and the anti-vibration table 1, thereby increasing the temperature of each portion.

The anti-vibration apparatus disclosed in the present invention aims at mounting precision equipment. In this field, however, contraction/expansion of members due to changes in the temperatures of the anti-vibration table 1 and the device mounted thereon greatly affects the measurement precision and operation precision of the precision equipment.

It is, therefore, preferable that pneumatic actuators such as the vertical pneumatic actuator 21 and the horizontal pneumatic actuator 22 as shown in FIG. 4 be used as actuators used in a displacement control operation or used to generate steady thrusts, and be used together with electromagnetic linear motors such as the vertical linear motor 31 and the horizontal linear motor 32 to damp and settle transitional vibrations produced upon positioning of the device.

<Vibration Control>

A vibration control operation to be performed on the basis of output signals from the vertical vibration sensor 26a and the horizontal vibration sensor 26b will be described next. In this case, this operation will be referred to as vibration control for the sake of descriptive convenience. First of all, the vertical and horizontal vibrations of the anti-vibration table 1 are respectively detected by the vertical vibration sensor 26a and the horizontal vibration sensor 26b. The resultant detection signals are input to a vibration compensation operation means 42 and compensated for. As the vertical vibration sensor 26a and the horizontal vibration sensor 26b, acceleration sensors are generally used. In this embodiment, acceleration sensors are used as the vertical vibration sensor 26a and the horizontal vibration sensor 26b.

In this vibration control operation, arithmetic processing such as proportional compensation and integral compensation or PI compensation (proportional/integral compensation) is performed for the signals obtained by the vertical vibration sensor 26a and the horizontal vibration sensor 26b. A vibration control operation is implemented by a method of feeding back a mass term by applying a force proportional to the acceleration of the anti-vibration table 1 to the anti-vibration table 1, a method of feeding back a damping term by applying a force proportional to the velocity of the anti-vibration table 1 to the anti-vibration table 1, a method combining the above methods, or the like.

A vibration control operation will be described below by exemplifying the method of damping the vibrations of the anti-vibration table 1 by applying a force proportional to the velocity of the anti-vibration table 1 to the anti-vibration table 1. In general, different compensation operation methods are used in a case wherein the vertical pneumatic actuator 21 and the horizontal pneumatic actuator 22 are used as actuators for implementing a vibration control operation and a case wherein the vertical linear motor 31 and the horizontal linear motor 32 are used for such actuators. Each compensation method will, therefore, be described below.

<Control of Pneumatic Actuators>

A control operation using the vertical pneumatic actuator 21 and the horizontal pneumatic actuator 22 will be described first. Assume that the response speed of each pneumatic actuator is very low, and the response frequency of a thrust generated in response to a driving command signal to the actuator is lower than the natural frequency of the vibration system constituted by the anti-vibration table 1 and the support mechanism for damping/supporting the anti-vibration table 1 by 10 times or more. The pneumatic actuator functions as an actuator having integral characteristics in a frequency region near the natural frequency of the vibration system of the anti-vibration table 1. A force proportional to the velocity of the anti-vibration table 1 can, therefore, be applied to the anti-vibration table 1 in the main band, i.e., the frequency region near the natural frequency of the vibration system of the anti-vibration table 1, by detecting the accelerations of the anti-vibration table 1 through the vertical vibration sensor 26a and the horizontal vibration sensor 26b, and feeding back the data obtained by performing proportional compensation (gain compensation) for the detected accelerations to the vertical pneumatic actuator 21 and the horizontal pneumatic actuator 22. Since each actuator has integral characteristics, a thrust proportional to the velocity of the anti-vibration table 1 is fed back to the anti-vibration table 1.

Assume that the response speed of each pneumatic actuator is very high, and the response frequency does not differ much from the natural frequency of the vibration system constituted by the anti-vibration table 1 and the support mechanism for damping/supporting the anti-vibration table 1. In this case, acceleration signals obtained from the vertical vibration sensor 26a and the horizontal vibration sensor 26b may be compensated for by using a PI compensation (proportional/integral compensation) device in which parameters are set to have a zero point at the response frequency of each pneumatic actuator, and the resultant signals may be fed back to the vertical pneumatic actuator 21 and the horizontal pneumatic actuator 22. With this operation, the zero point of the PI compensation device cancels out the pole (eigenvalue) of each pneumatic actuator, and a combination of the outputs from the PI compensation device and the pneumatic actuator becomes an integral element. As a result, a force proportional to the integral of the accelerations of the anti-vibration table 1, i.e., a velocity proportional signal, is applied to the anti-vibration table 1.

<Control of Linear Motors>

A vibration control operation using the vertical linear motor 31 and the horizontal linear motor 32 will be described next. In general, the response frequencies of thrusts generated by electromagnetic linear motors such as the vertical linear motor 31 and the horizontal linear motor 32 in response to driving command signals are much higher than the natural frequency of the vibration system constituted by the anti-vibration table 1 and the support mechanism for damping/supporting the anti-vibration table 1. The natural frequency of the vibration system constituted by the anti-vibration table 1 and the support mechanism for damping/supporting the anti-vibration table 1 ranges from several Hz to a maximum of about several tens of Hz. On the other hand, an electromagnetic linear motor has a relatively large inductance if the number of turns of the coil is large. When this motor is driven by a circuit of a voltage control type, the response frequency may sometimes become 100 Hz or less. In general, however, the electromagnetic linear motor is driven by a driving circuit with current feedback. In this case, owing to the effect of current feedback, a response frequency of 100 Hz or more can be easily realized. It can, therefore, be assumed that the electromagnetic linear motor has gain characteristics in the frequency region near the natural frequency of the vibration system of the anti-vibration table 1. As a consequence, a force proportional to the velocity of the anti-vibration table 1 can be applied to the anti-vibration table 1 by performing integral compensation for the accelerations of the anti-vibration table 1 which are detected by the vertical vibration sensor 26a and the horizontal vibration sensor 26b, and feeding back the resultant data to the vertical linear motor 31 and the horizontal linear motor 32.

As shown in FIG. 4, in the anti-vibration apparatus disclosed in the present invention, a vibration control operation based on acceleration signals obtained from the anti-vibration table 1 and the like is preferably performed mainly by using the electromagnetic linear motors having fast-response characteristics. This is because control must be performed by following a driving reaction force of the X-Y stage, which operates at a high speed/acceleration and high response speed. If vibration control is performed by using the pneumatic actuators, which are lower in response speed than the electromagnetic linear motors, the high-speed/-acceleration operation of the X-Y stage cannot be properly followed. In addition, the apparatus may be forced to use the pneumatic actuators beyond their capacities, resulting in undesirable variations in apparatus characteristics. In a vibration control operation, therefore, it is preferable that the electromagnetic linear motors be used or the load ratio of the electromagnetic linear motors to the pneumatic actuators be increased.

In this embodiment, a displacement control operation for the anti-vibration table 1 is preferably performed by extracting deviation signals with respect to the reference positions in the respective motion modes of the anti-vibration table 1, e.g., translation and rotation, from target values in the respective motion modes of the anti-vibration table 1, e.g., translation and rotation, with respect to the reference positions and output signals from a plurality of displacement detection means for detecting the vertical and horizontal displacements of the anti-vibration table 1 with respect to the reference positions, performing a compensation operation for the signals, and distributing the resultant operation mode compensated signals to the respective actuators that are arranged at each portion of the anti-vibration table 1 to apply control forces to the anti-vibration table 1.

Likewise, in this embodiment, a vibration control operation for the anti-vibration table 1 is preferably performed by extracting vibration signals for the respective motion modes of the anti-vibration table 1, e.g., translation and rotation, from output signals form a plurality of vibration detection means for detecting the vertical and horizontal vibrations of the anti-vibration table 1, performing a compensation operation for the signals, and distributing the resultant motion mode compensated signals to the respective actuators that are arranged at each portion of the anti-vibration table 1 to apply control forces to the anti-vibration table 1.

A control operation for each actuator based on signals from the above displacement detection means, vibration detection means, and other devices will be described next.

The manner in which the above electromagnetic linear motors or pneumatic actuators are driven by performing an appropriate compensation operation based on signals from a control means or the operation state of a device having a driving means such as an X-Y stage and mounted on the anti-vibration table 1 will be described first.

Assume that a device having a driving means such as an X-Y stage 45 is mounted on the anti-vibration table 1, as shown in FIG. 4. This X-Y stage 45 can move in two arbitrary directions, i.e., the X and Y directions, using linear mechanisms constituted by electromagnetic motors and ball screws or electromagnetic linear motors. Each electromagnetic motor or electromagnetic linear motor for driving the X-Y stage 45 is driven by an X-Y stage driving circuit 47 on the basis of a signal from an X-Y stage control means 46.

In this case, a control operation is performed by using a feedforward compensation operation means for receiving a signal from the X-Y stage control means 46 or a signal associated with the driven state of the X-Y stage, performing appropriate arithmetic processing for the signal, and sending the processing result to the driving circuit for the corresponding actuator for applying a control force to the anti-vibration table 1.

The following two feedforward compensation operation methods are available. In the first method, a compensation operation is performed to cancel out a driving reaction force produced when the X-Y stage 45 is driven. In the second method, a compensation operation is performed to correct the tilt of the anti-vibration table 1 due to load movement by compensating for a change in the moment balance of the anti-vibration table support mechanism upon movement of the load of the X-Y stage 45 over the anti-vibration table 1.

The former method can be implemented by performing an appropriate compensation operation by using bandpass filters and the like in a first feedforward compensation operation means 43, mainly on the basis of signals proportional to the accelerations of the X-Y stage 45 or driving reaction forces of the X-Y stage, so as to apply forces proportional to the accelerations or driving reaction forces to the anti-vibration table 1 in a desired control frequency band. The compensated signals obtained as outputs from the first feedforward compensation operation means 43 are sent to the electromagnetic linear motors such as the vertical linear motor 31 and the horizontal linear motor 32 to cancel out the driving reaction forces generated when the X-Y stage 45 is driven. To cope with the high-speed/-acceleration operation of the X-Y stage 45, the actuators to be used must be electromagnetic linear motors.

The latter method can be implemented by performing an appropriate compensation operation using bandpass filters and the like in a second feedforward compensation operation means (not shown in FIG. 4) mainly on the basis of signals proportional to the displacements of the X-Y stage 45. The compensated signals obtained as outputs from the second feedforward compensation operation means are sent to pneumatic actuators such as the vertical pneumatic actuator 21 and the horizontal pneumatic actuator 22 to compensate for changes in the moment balance of the anti-vibration table support mechanism due to movement of the load of the X-Y stage 45 over the anti-vibration table 1. In this operation, a force must be steadily generated to maintain the steady moment balance of the support mechanism which depends on the position of the X-Y stage 45, and hence the pneumatic actuators are preferably used.

In these control operations, similar to the displacement and vibration control operations described above, it is preferable that pieces of information about the forces, accelerations, and displacements produced upon driving of the X-Y stage be converted into signals corresponding to the respective motion modes of the anti-vibration table 1, e.g., translation and rotation, an appropriate compensation operation be performed in units of motion modes, and the resultant compensated signals be distributed to the respective actuators that are arranged for each portion of the anti-vibration table 1 to apply control forces to the anti-vibration table 1.

The apparatus disclosed in the present invention may include a control system for detecting vibrations of an apparatus installation pedestal such as a floor on which the anti-vibration system constituted by the anti-vibration table 1 and the support mechanism for damping/supporting the anti-vibration table, appropriately compensating for the resultant detection signals, and feedforward-controlling the compensated signals to the actuators for applying control forces to the anti-vibration table 1 in addition to the control system of driving the actuators for applying control forces to the anti-vibration table 1 by performing an appropriate compensation operation based on the control loop for the above position control operation and vibration control operation, the operation state of a device having a driving means such as an X-Y stage and mounted on the anti-vibration table 1, or signals from a control means for the device.

According to this embodiment, the heavy anti-vibration table on which precision equipment and the like are mounted can be supported at a predetermined position by using the pneumatic actuators that can steadily generate large thrusts, and the high-speed/-acceleration operation of a mounted device such as an X-Y stage can be properly coped with by using the electromagnetic actuators with fast-response characteristics, thus realizing quick vibration control. Therefore, both the anti-vibration performance and vibration control performance requirements can be satisfied, which cannot be satisfied by the conventional anti-vibration table.

In this embodiment, both the anti-vibration performance and vibration control performance requirements in the horizontal direction can be satisfied as well as in the vertical direction by using the pneumatic actuators, each having a backlash in a direction perpendicular to the direction in which a force is generated, in combination of the noncontact type electromagnetic linear motors. In addition, since the pneumatic actuators having bellows structures are used, the respective components of the anti-vibration apparatus can be made more compact and can be efficiently arranged, thus realizing an integral anti-vibration apparatus as a unit. In this embodiment, the pneumatic actuators and the electromagnetic linear motors are arranged in both the vertical and horizontal directions. Assume, however, that there is a specific displacement mode or vibration mode to be removed in a given direction, and the mode can be removed by using only a pneumatic actuator or electromagnetic linear motor. In this case, both the pneumatic actuator and the electromagnetic linear motor need not be set in this direction.

In this embodiment, since the coil winding of each electromagnetic actuator is mounted on a member on the apparatus installation pedestal side, the adverse effect on the precision equipment on the anti-vibration table owing to a temperature rise caused by the heat generated by the coil can be reduced. In addition, the coil windings can be easily located and can be suitably used for an anti-vibration/damping apparatus for precision equipment. Furthermore, since the linear motors used in this embodiment have flat structures, the degree of freedom in the spatial arrangement of the apparatus is higher than that in a case wherein electromagnetic motors such as cylindrical voice coil motors are used. Therefore, an active anti-vibration apparatus having a compact structure can be realized.

Second Embodiment

Figure 5:
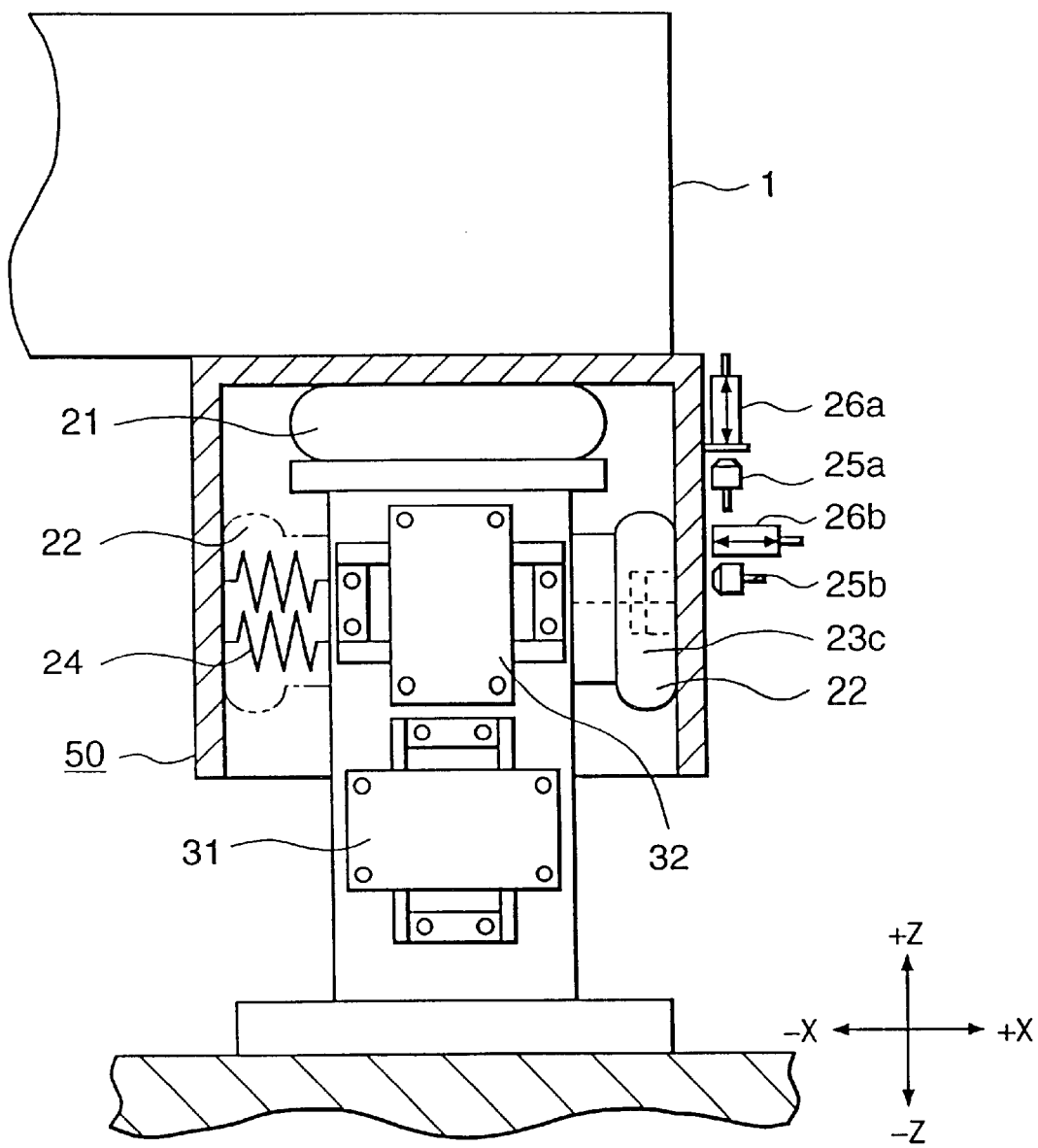
FIG. 5 is a schematic view showing an anti-vibration apparatus according to the second embodiment of the present invention.

FIG. 5 is a schematic view showing an active anti-vibration apparatus according to the second embodiment.

A horizontal pneumatic actuator 22 in FIG. 5 is a pneumatic actuator of the type having a pre-pressurizing mechanism 24 such as a coil spring dynamically parallel to a pneumatic spring 23c. Other components and control methods are the same as those in the first embodiment, and hence, a description thereof will be omitted.

A predetermined amount of pre-pressure is kept applied to the pre-pressurizing mechanism 24 in a contraction direction at a neutral position in the horizontal pneumatic actuator 22. In this embodiment, by raising the internal pressure of the pneumatic spring 23c, a force can be applied to an anti-vibration table 1 in the +X direction indicated by the arrow in FIG. 5. In addition, when the internal pressure of the pneumatic spring 23c is decreased, the overall actuator can generate a force in the −X direction owing to the elastic force of the pre-pressurizing mechanism 24 dynamically parallel to the pneumatic spring 23c, although the pneumatic spring 23c itself cannot generate any force in the contraction direction.

Although FIG. 5 shows the horizontal pneumatic actuator 22, in an anti-vibration unit 50, which corresponds to only one horizontal direction, control forces can be applied in a plurality of arbitrary directions by using two or more horizontal pneumatic actuators.

In this embodiment, it is preferable that the axis of action of the pre-pressurizing mechanism almost coincides with the axis of action of the pneumatic spring. It is also preferable that the axes of action of the horizontal linear motors almost coincides with the axis of action of the pneumatic actuator. According to this embodiment, the same effects as those of the embodiment described above can be obtained. In addition, since only one pneumatic spring is required in the horizontal direction, piping of the pneumatic spring and installation of a pressure control apparatus are facilitated.

Third Embodiment

Figure 6A:
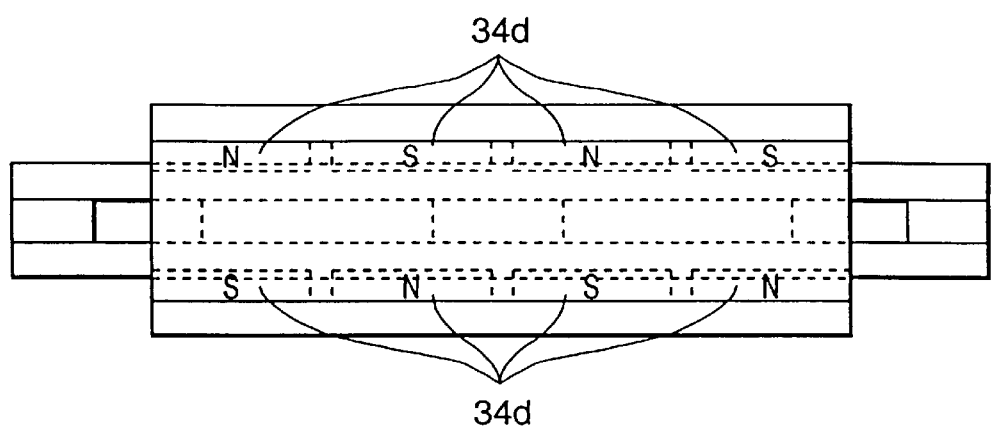
FIGS. 6A and 6B are schematic views showing an electromagnetic linear motor used in an anti-vibration apparatus according to the third embodiment of the present invention.
Figure 6B:
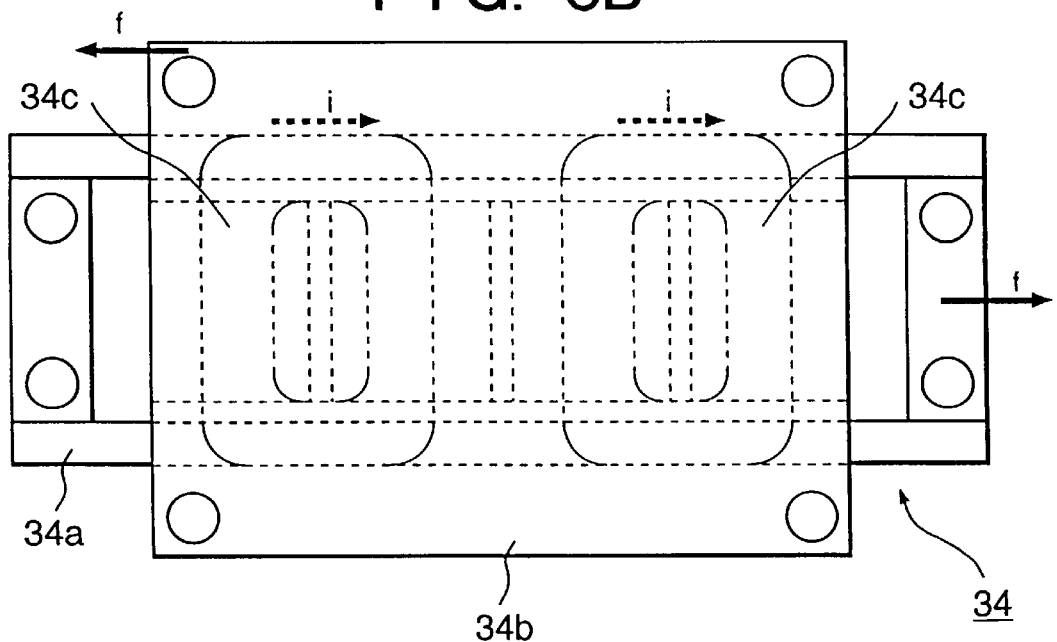

FIGS. 6A and 6B are schematic views showing an electromagnetic linear motor used in an active anti-vibration apparatus according to the third embodiment.

The linear motor in the above embodiment is a single-phase linear motor having one coil winding. The linear motor in this embodiment uses two coil windings.

The electromagnetic linear motor in these figures is comprised of a coil assembly 34a including two coil windings and a magnet assembly 34b having four pairs of opposing permanent magnets. This motor is obtained by connecting two single-phase linear motors, each described as the first example of the electromagnetic linear motor, in series in a thrust generating direction. A force in the direction indicated by an arrow f in FIG. 6B can be applied between the two assemblies by feeding a current through each coil winding in the direction indicated by an arrow i.

Since the coil and magnet assemblies are integrally formed while ensuring thrust characteristics corresponding to the two single-phase linear motors described above, the electromagnetic linear motor with this arrangement can save the dimensions of portions where these components are mounted. Therefore, the dimensions of the space required to mount the electromagnetic linear motor on the anti-vibration unit can be further reduced.

In addition, a plurality of electromagnetic linear motors, each identical to the one described above, may be arranged at each portion of an anti-vibration table 1. In addition, these electromagnetic linear motors may be formed into several groups, and a plurality of electromagnetic linear motors included in the same group may be driven by the same driving command signal. Likewise, these electromagnetic linear motors may be arranged at each portion of the anti-vibration table 1. In addition, the coil windings of the respective electromagnetic linear motors may be formed into several groups, and the coil windings of the electromagnetic linear motors included in the same group may be driven by the same driving command signal.

The plurality of electromagnetic linear motors or coil windings driven by the same driving command signal may be further formed into several groups (at least one group), and a plurality of electromagnetic linear motors or coil windings included in the same group may be electrically connected in parallel or series to be driven.

The control system required to drive a plurality of electromagnetic linear motors can be simplified by driving the electromagnetic linear motors or coil windings in the same group using the same driving signal. In addition, the control system for a plurality of linear motors can be simplified by electrically connecting the electromagnetic linear motors or coil windings in the same group in series or parallel and driving them.

With the use of the linear motor in this embodiment as each electromagnetic linear motor of an active anti-vibration apparatus, the same effects as those obtained in the first and second embodiments can be obtained.

Fourth Embodiment

Figure 7A:
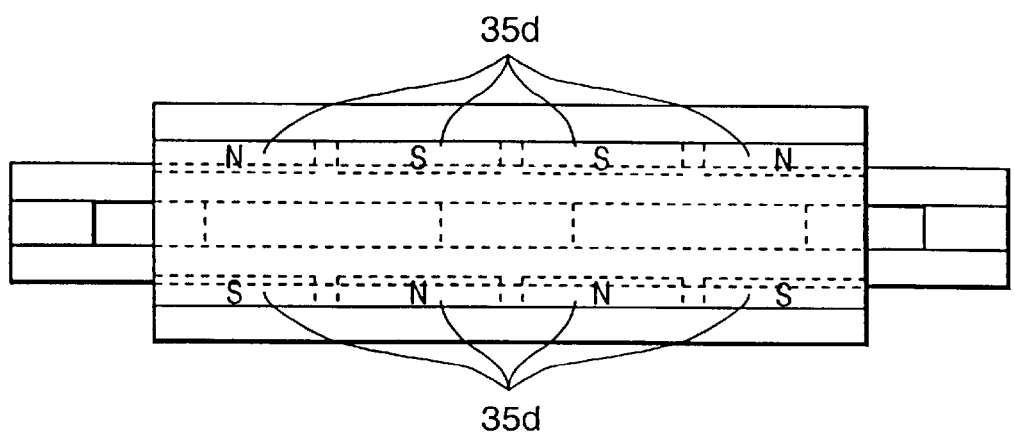
FIGS. 7A and 7B are schematic views showing an electromagnetic linear motor used in an anti-vibration apparatus according to the fourth embodiment of the present invention.
Figure 7B:
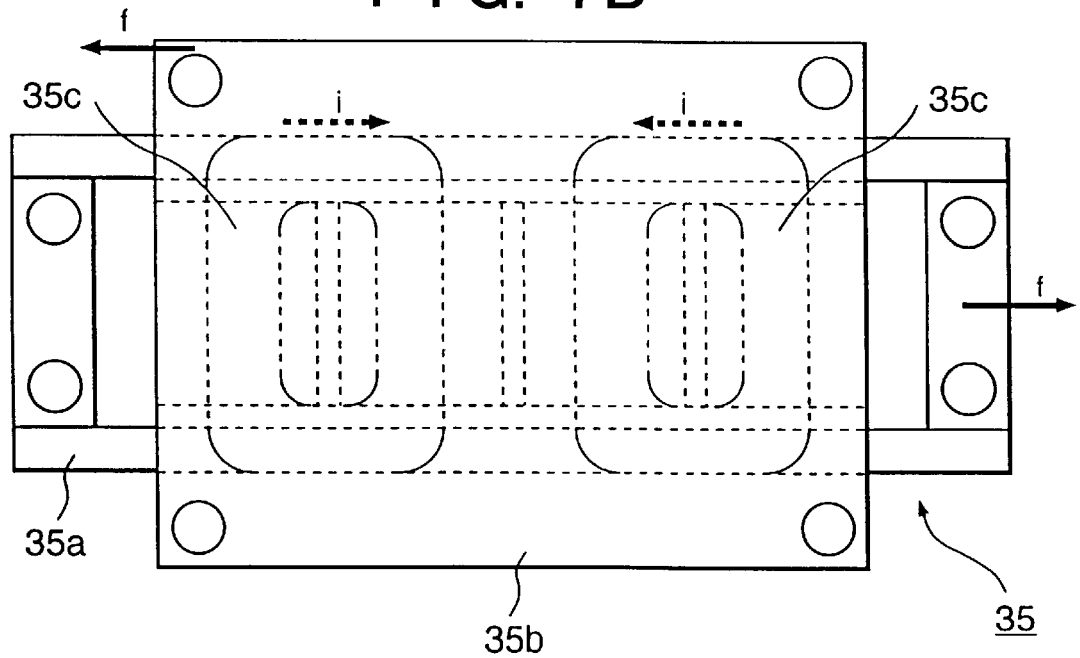

FIGS. 7A and 7B are schematic views showing an electromagnetic linear motor used in an active anti-vibration apparatus according to the fourth embodiment.

The electromagnetic linear motor in these figures is comprised of a coil assembly 35a including two coil windings and a magnet assembly 35b having four pairs of opposing permanent magnets. This motor is obtained by connecting two single-phase linear motors, each identical to the one in the first embodiment, in series in a thrust generating direction so as to have an integral structure.

In the coil assembly 34a of the linear motor in the third embodiment in FIGS. 6A and 6B, the magnets with the polarity arrangement "NSNS" are arranged opposite to the magnets with the polarity arrangement "SNSN". In contrast to this, in the coil assembly 35a of the linear motor in this embodiment, the magnets with the polarity arrangement "NSSN" are arranged opposite to the magnets with the polarity arrangement "SNNS".

A thrust in the direction indicated by the direction indicated by an arrow f in FIG. 6B can be applied between the two assemblies by feeding a current through each coil winding in the direction indicated by an arrow i. In this case, to generate thrusts in the same direction, coil currents are fed through the two coil windings in different directions.

Figure 8A:
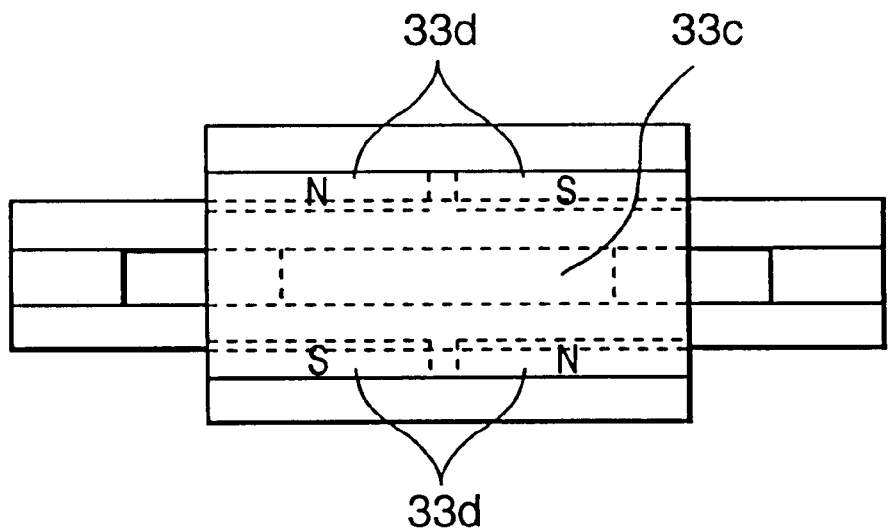
FIGS. 8A and 8B are views for explaining driving forces generated in a single-phase linear motor.
Figure 8B:
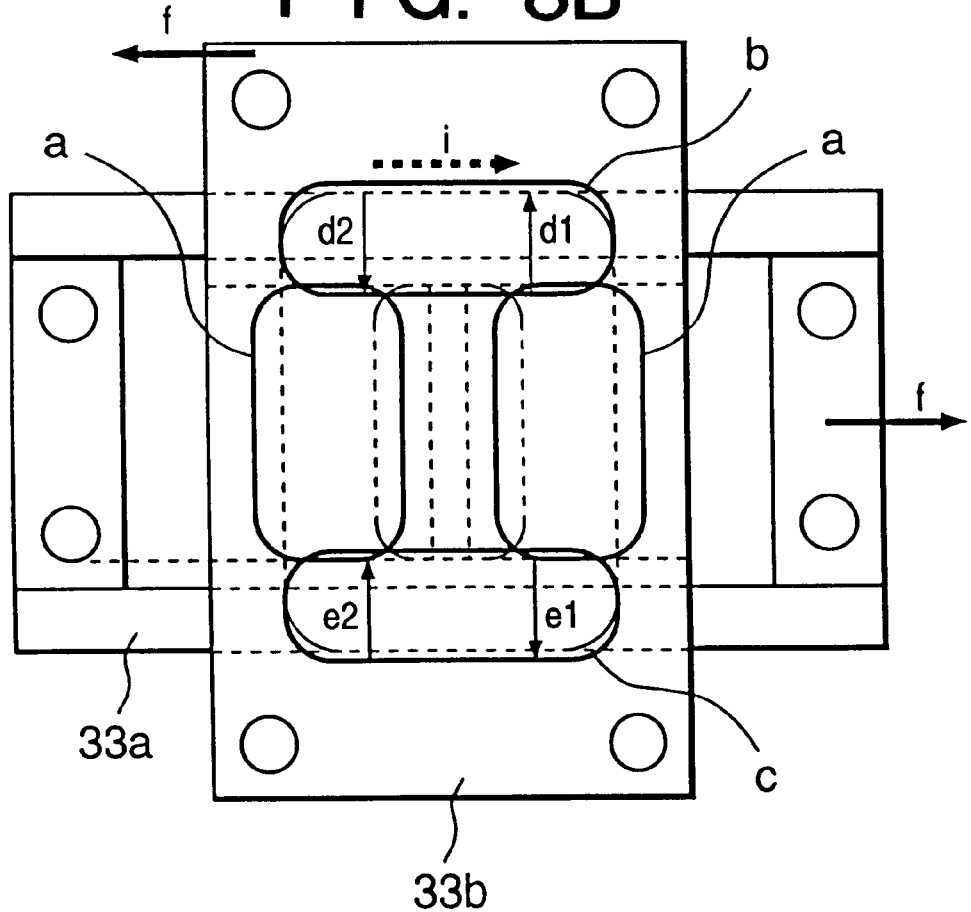

FIGS. 8A and 8B are schematic views showing a single-phase linear motor. In this single-phase linear motor, coil portions that do not contribute to the generation of a thrust in a predetermined direction may generate other thrust components owing to the interaction between the coil portions and the magnetic field. In this electromagnetic linear motor, the portions that contribute to the generation of the thrust in the predetermined direction are portions a in FIG. 8B, whereas portions b and c in FIG. 8B do not contribute to the generation of the thrust in the predetermined direction but generate thrusts between the coil and magnet assemblies in the directions indicated by arrows in directions d1, d2, e1, and e2 owing to the interaction between the currents flowing through the coil portions and the magnetic field generated by the magnet assembly. The directions of the arrows show the directions of the thrust where it acts on the coil.

In this case, if the portions b and c have identical and symmetrical shapes, and the magnetic flux distributions at the portions b and c are identical, the thrusts as other components indicated by the arrows d1, d2, e1, and e2 cancel each other. In practice, however, the leading portion of the coil winding from the start or end of the winding to the lead wire of the electromagnetic linear motor is sometimes processed on the portion b or c. As a result, the portions b and c of the coil winding may differ in their shapes. In addition, the portions b and c of the coil winding often differ in their shapes owing to the problem of cost or techniques in the manufacture of the coil winding. Furthermore, different magnetic flux distributions may appear at the portions b and c owing to the influences of variations in magnetization of the permanent magnets arranged on the magnet assembly or the positioning precision of the coil and magnet assemblies. In this case, other thrust components d1 and d2 generated at the portion b differ from other thrust components e1 and e2 generated at the portion c. As a result, other thrust components are generated in directions other than the thrust direction of the electromagnetic linear motor. The other thrust components become larger as the electromagnetic linear motor generates a larger thrust.

Since an electromagnetic linear motor of this type, in particular, has no mechanical motion restraint mechanism between the coil and magnet assemblies, other thrust components directly become disturbance forces. Owing to the structural characteristics of this electromagnetic linear motor, these disturbance forces act as moments that cause mainly the coil and magnet assemblies to mutually rotate about the magnetic field direction.

In an electromagnetic linear motor of the type described in the third embodiment shown in FIGS. 6A and 6B, for the same reason as that described above, other thrust components may be generated between the coil and magnet assemblies.

In a linear motor in which permanent magnets with the polarity arrangement "NSSN" are arranged opposite to permanent magnets with the polarity arrangement "SNNS", like the electromagnetic linear motor in this embodiment shown in FIGS. 7A and 7B, when currents are fed through the two coils to generate thrusts in the same direction, coil winding portions of the two coils that do not contribute to the generation of thrusts in a predetermined direction act on the two coil windings in opposite directions. As a consequence, the moments generated by these portions act in directions to cancel out each other, and hence, the moments generated between the coil and magnet assemblies can be reduced. Especially, when the two coil windings are arranged in magnetic fields with similar magnetic flux densities, and equal currents are fed through the two coil windings, components, i.e., moments, other than the above thrusts can be almost canceled out. When, therefore, an electromagnetic linear motor is to be applied to an anti-vibration unit as in this embodiment of the present invention, a motor of the type described above is preferably used, in which magnets with the polarity arrangement "NSSN" are arranged opposite to magnets with the polarity arrangement "SNNS", and two coils are arranged between these magnet arrays.

This embodiment can obtain the same effects as those described in the first to third embodiments, in addition to the effects described above.

Fifth Embodiment

FIGS. 9A and 9B are schematic views showing an electromagnetic linear motor used in an active anti-vibration apparatus according to the fifth embodiment.

In this embodiment, as shown in these figures, the motor is comprised of two coil windings and three pairs of permanent magnets. This motor is of the type obtained by integrating the two electromagnetic linear motors described above. More specifically, magnets with the polarity arrangement "NSSN" are arranged opposite to magnets with the polarity arrangement "SNNS", and the two middle permanent magnets of each magnet array are integrated into one unit. That is, the permanent magnets with the polarity arrangement "NSN" are arranged opposite to the permanent magnets with the polarity arrangement "SNS" to form a magnetic circuit.

This structure can reduce the number of parts, i.e., permanent magnets required, and hence contributes to a reduction in cost as compared with the above electromagnetic linear motor using four pairs of permanent magnets.

Note that when the electromagnetic linear motor having these two coil windings is to be used, this motor is preferably applied as a moving magnet type to the apparatus such that the coil assembly is mounted on an apparatus installation pedestal or a member firmly fastened to the pedestal, and the magnet assembly is mounted on an anti-vibration table 1 or a member firmly fastened to the anti-vibration table 1.

This embodiment can obtain the same effects as those described in the first to fourth embodiments, in addition to the effects described above.

Sixth Embodiment

Figure 10A:
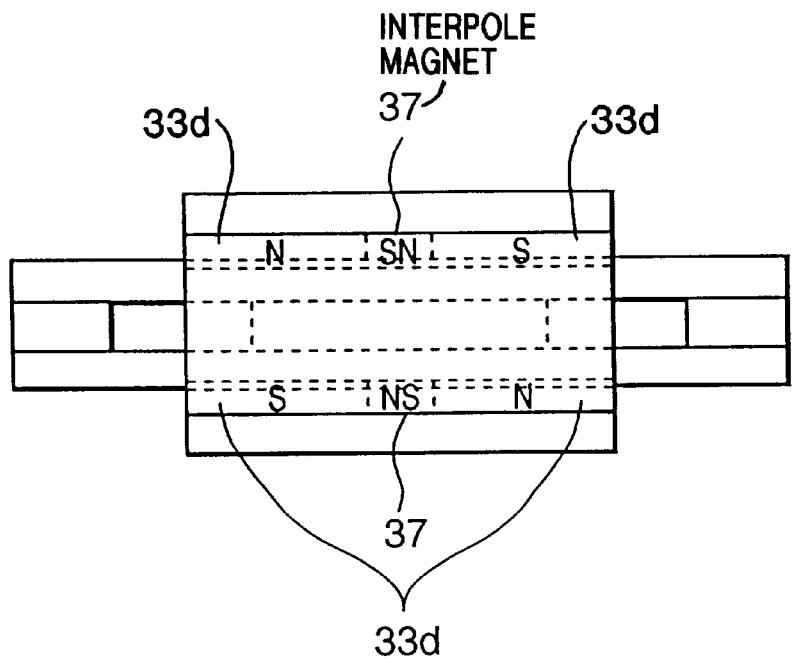
FIGS. 10A and 10B are schematic views showing an electromagnetic linear motor used in an anti-vibration apparatus according to the sixth embodiment of the present invention.
Figure 10B:
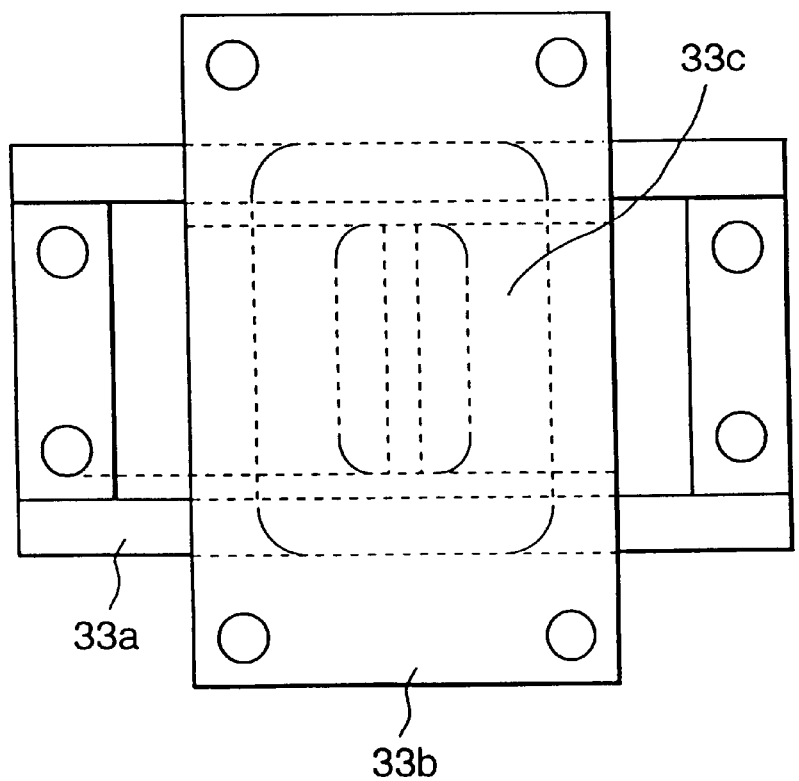

FIGS. 10A and 10B are schematic views showing an electromagnetic linear motor used in an active anti-vibration apparatus according to the sixth embodiment.

In this embodiment, interpole magnets 37 are used in the magnet assembly of the single-phase linear motor.

As in this embodiment, when interpole magnets are added to the main magnets in the magnetic circuit of the electromagnetic linear motor, the magnetic flux distribution of the magnetic field in which the coil assembly is present can be adjusted more properly, and the magnetic flux in the space where the coil is present can be made more uniform and stronger. This can increase the thrust constant of the electromagnetic linear motor.

Referring to FIGS. 10A and 10B, although the single-phase linear motor is used, the present invention is not limited to this. Interpole magnets like those in this embodiment can be applied to an electromagnetic linear motor having a plurality of coil windings as in the third to fifth embodiments described above.

This embodiment can obtain the same effects as those described in the first to fifth embodiments, in addition to the above effects.

Seventh Embodiment

Figure 11:
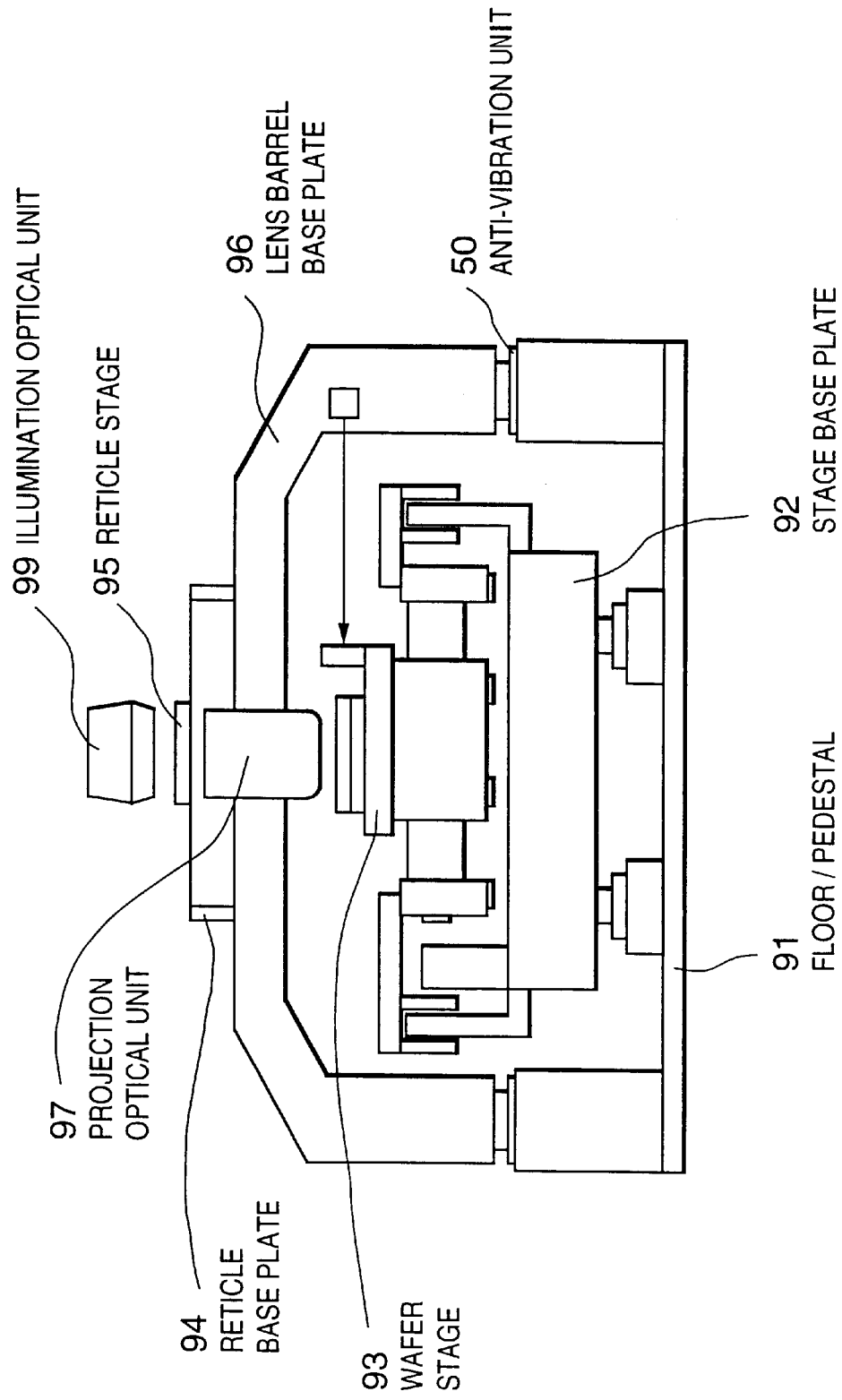
FIG. 11 is a schematic view showing an exposure apparatus according to the seventh embodiment of the present invention.

An embodiment of a scan type exposure apparatus using the anti-vibration apparatus of the above embodiment will be described next with reference to FIG. 11.

A lens barrel base plate 96 is supported on a floor or pedestal 91 through an anti-vibration unit 50. The lens barrel base plate 96 supports a reticle base plate 94 and a projection optical unit 97 positioned between a reticle stage 95 and a wafer stage 93. The wafer stage 93 is supported on a stage base plate 92 supported by the floor or pedestal 91. The wafer stage 93 mounts and positions a wafer. The reticle stage 95 is supported on the reticle base plate 94 supported by the lens barrel base plate 96, and can move while mounting a reticle. An illumination optical unit 99 emits exposure light to expose the reticle mounted on the reticle stage 95 onto the wafer on the wafer stage 93.

Note that the wafer stage 93 is scanned in synchronism with the reticle stage 95. While the reticle stage 95 and the wafer stage 93 are scanned, their positions are continuously detected by interferometers, and the resultant data are respectively fed back to driving units for the reticle stage 95 and the wafer stage 93. With this operation, the scan start positions of the two stages can be accurately synchronized, and the scanning speed in a constant-speed scanning region can be controlled with high precision.

With the use of the active anti-vibration apparatus of the above embodiment, this embodiment properly has both the anti-vibration performance against external vibrations affecting the lens barrel base plate and the stage base plate 92 and the proper vibration control performance against vibrations generated in the translation and rotation directions upon movement of the reticle stage and the wafer stage. This embodiment can, therefore, perform high-speed, high-precision exposure.

In this embodiment, the stage base plate 92 and the lens barrel base plate 96 are independently arranged, and the anti-vibration apparatuses are used for the respective components. Even if, however, a lens barrel base plate and the stage base plate are integrally formed and mounted on the same anti-vibration apparatus, the same effects as those described above can be obtained by using the active anti-vibration apparatus of the above embodiment as this anti-vibration apparatus. That is, high-speed, high-precision exposure can be performed. In this case, since the stage base plate for supporting a wafer and the reticle base plate for supporting a reticle are supported on the floor through the same anti-vibration unit, the anti-vibration unit may be controlled by using a feedforward compensation operation means for sending signals to driving circuits for actuators for applying control forces on the basis of signals from stage control means for both the wafer and reticle stages.

Eighth Embodiment

Figure 12:
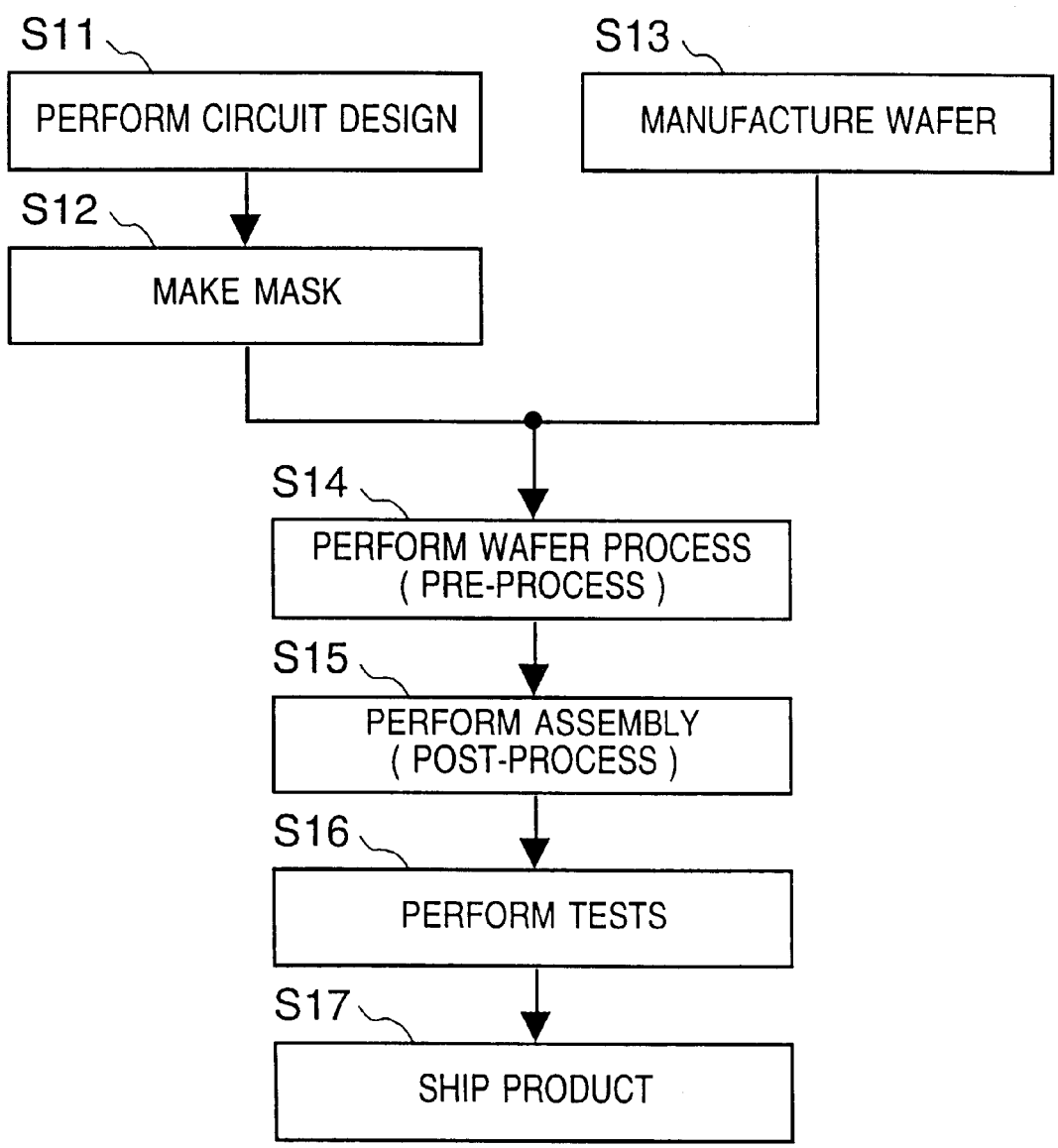
FIG. 12 is a flow chart showing a wafer manufacturing process.

An embodiment of a semiconductor device manufacturing method using the above exposure apparatus will be described next. FIG. 12 is a flow chart showing a manufacturing process for a semiconductor device (e.g., a semiconductor chip such as an IC or LSI, a liquid crystal panel, a CCD, or the like). In step 11 (circuit design), the circuit of a semiconductor device is designed. In step 12 (mask formation), a mask on which the designed circuit pattern is formed is formed. In step 13 (wafermanufacture), a wafer is manufactured by using a material such as silicon. In step 14 (waferprocess), which is referred to as a pre-process, the prepared mask and wafer are used to form an actual circuit on the wafer using a lithographic technique. In step 15 (assembly), which is referred to as a post-process, a semiconductor chip is formed by using the wafer manufactured in step 14. This process includes steps such as the assembly step (dicing and bonding) and the packaging step (chip encapsulation). In step 16 (test), tests such as an operation test and a durability test are performed with respect to the semiconductor device manufactured in step 15. The semiconductor device is completed through these steps and shipped (step S17).

Figure 13:
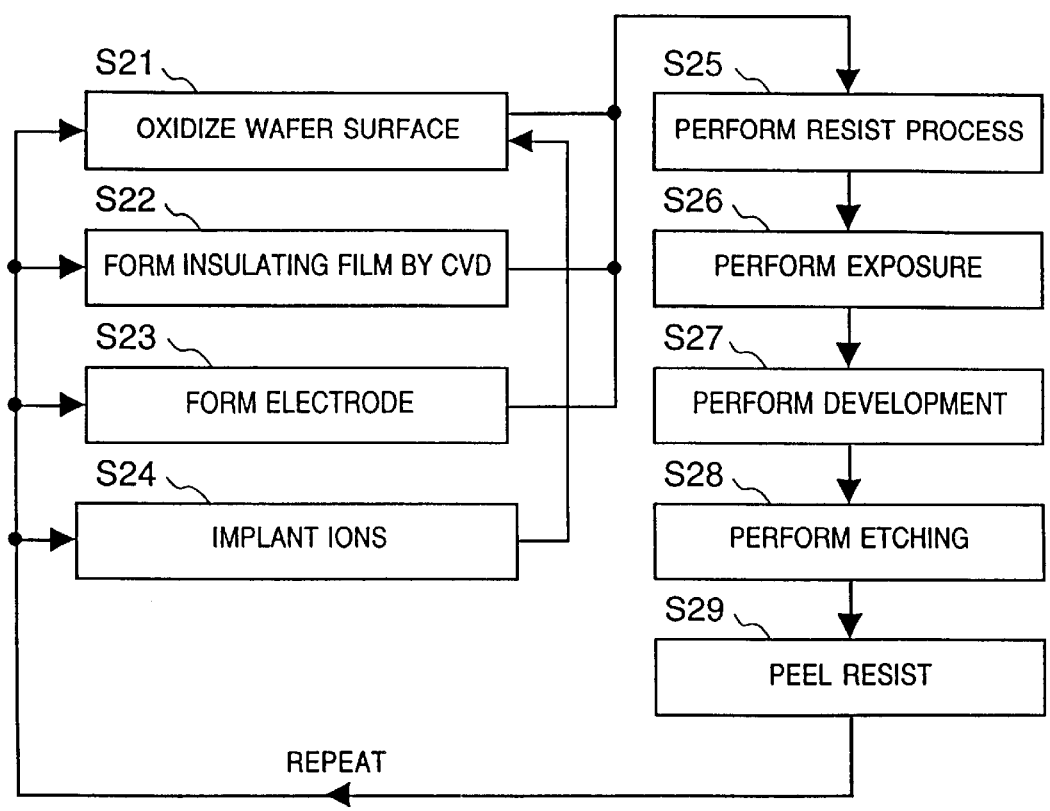
FIG. 13 is a flow chart showing a semiconductor device manufacturing process.

FIG. 13 is a flow chart showing the above wafer manufacturing process in detail. In step 21 (oxidation), the upper surface of a wafer is oxidized. In step 22 (CVD), an insulating film is formed on the upper surface of the wafer. In step 23 (electrode formation), an electrode is formed on the wafer by vapor deposition. In step 24 (ion implantation), ions are implanted into the wafer. In step 25 (resist process), the wafer is coated with a photoresist. In step 26 (exposure), the circuit pattern on the mask is printed/exposed on the wafer by the above exposure apparatus. In step 27 (development), the exposed wafer is developed. In step 28 (etching), portions other than the developed resist image are removed. In step 29 (resist peeling), the unnecessary resist after etching is removed. By repeating these steps, multiple circuit patterns can be formed on the wafer. A high-integration semiconductor device, which is difficult to manufacture in the prior art, can be manufactured by using the manufacturing method of this embodiment.

The anti-vibration apparatus according to the present invention can actively reduce vibrations of an object by generating forces in the vertical and horizontal directions against the anti-vibration table. In addition, the respective components of this apparatus can be made more compact and efficiently arranged to provide a compact anti-vibration apparatus.

In addition, since vibrations of the components of the exposure apparatus of the present invention are damped with high precision, the apparatus can perform high-speed, high-precision exposure.

Furthermore, a device can be manufactured at high speed with high precision by the device manufacturing method of the present invention.

Moreover, according to the anti-vibration method of the present invention, vibrations of a damped/supported object can be accurately damped and eliminated in the vertical and horizontal directions, and vibrations of the equipment mounted on the anti-vibration apparatus can be accurately damped and eliminated in the vertical and horizontal directions. In addition, the anti-vibration apparatus can damp vibrations of a mounted device by using feedforward-controlling, that is implemented by compensating for the values of signals of the equipment mounted on the anti-vibration apparatus and driving the actuators on the basis of the compensated signals. The present invention is not limited to the above embodiments and various changes and modifications can be made within the spirit and scope of the present invention. Therefore, to appraise the public of the scope of the present invention, the following claims are made.

What is claimed is:

1. An anti-vibration apparatus for actively damping vibrations of an object by generating control forces to reduce the vibrations, said apparatus comprising:

a first actuator for generating a first control force; and a second actuator for generating a second control force, said second actuator using a driving principle different from that of said first actuator, wherein said first actuator generates forces in vertical and horizontal directions, and said second actuator generates a force at least in one of the vertical and horizontal directions.

2. The apparatus according to claim 1, wherein said first actuator has one of a pneumatic actuator and an electromagnetic linear motor, and said second actuator has the other of said pneumatic actuator and said electromagnetic linear motor.

3. The apparatus according to claim 1, wherein said first actuator includes two actuators for generating forces in the vertical and horizontal directions.

4. The apparatus according to claim 1, wherein said second actuator includes two actuators for generating forces in the vertical and horizontal directions.

5. The apparatus according to claim 1, wherein said actuator for generating the force in the horizontal direction has said opposing pneumatic actuator.

6. The apparatus according to claim 1, wherein said actuator for generating a force in the horizontal direction includes said pneumatic actuator and a pre-pressurizing mechanism.

7. The apparatus according to claim 1, wherein an axis of action of said first actuator for generating the force in the vertical direction substantially coincides with an axis of action of said second actuator for generating the force in the vertical direction.

8. The apparatus according to claim 1, wherein an axis of action of said first actuator for generating the force in the horizontal direction substantially coincides with an axis of action of said second actuator for generating the force in the horizontal direction.

9. The apparatus according to claim 1, wherein fixation parts of said first and also said second actuators are established as a unit, and mobile parts of said first and also said second actuators are established as a unit.

10. The apparatus according to claim 1, wherein the fixation part of said first actuator for generating a force in the vertical direction and a fixation part of said first actuator for generating a force in the horizontal direction are established as a unit, and a mobile part of said first actuator for generating a force in the vertical direction and a mobile part of said first actuator for generating a force in the horizontal direction are established as a unit.

11. The apparatus according to claim 1, wherein said anti-vibration apparatus comprises at least one of passive elastic support means and passive vibration damping means.

12. The apparatus according to claim 1, further comprising displacement detection means for detecting a displacement of a control target.

13. The apparatus according to claim 1, further comprising vibration detection means for detecting vibrations of a control target.

14. The apparatus according to claim 13, wherein said vibration detection means is an acceleration sensor.

15. The apparatus according to claim 13, wherein said vibration detection means is a velocity sensor.

16. The apparatus according to claim 1, wherein said first or second actuator is driven on the basis of at least one of output signals from said displacement detection means and said vibration detection means.

17. The apparatus according to claim 12, wherein the output signal from said displacement detection means is fed back to said pneumatic actuator.

18. The apparatus according to claim 13, wherein the output signal from said vibration detection means is fed back to said electromagnetic linear motor.

19. The apparatus according to claim 2, wherein said pneumatic actuator movement is permitted in a direction perpendicular to a direction in which a force is generated.

20. The apparatus according to claim 19, wherein said pneumatic actuator has a bellows structure.

21. The apparatus according to claim 2, wherein said pneumatic actuator has a pressure control valve for adjusting an internal pressure or a flow rate valve for adjusting a flow rate of air supplied/exhausted.

22. The apparatus according to claim 21, wherein said pneumatic actuator comprises a pressure sensor for detecting an internal pressure, and has a pressure control loop for actuating at least one of said pressure control valve and said flow rate control valve on the basis of a compensation signal obtained from a pressure compensation means, which performs a compensation operation on the basis of an output signal of said pressure sensor.

23. The apparatus according to claim 2, wherein said electromagnetic linear motor is a moving magnet type linear motor.

24. The apparatus according to claim 2, wherein said electromagnetic linear motor has a structure in which a coil is placed in a magnetic field between a plurality of opposing magnets.

25. The apparatus according to claim 2, wherein said electromagnetic linear motor is a single-phase linear motor having one coil.

26. The apparatus according to claim 2, wherein said electromagnetic linear motor is a polyphase linear motor having a plurality of coils.

27. The apparatus according to claim 26, wherein each of said plurality of coils is energized in a direction opposite to a direction in which a current flows in a corresponding adjacent coil.

28. The apparatus according to claim 2, wherein said electromagnetic linear motor comprises an interpole magnet.

29. The apparatus according to claim 1, wherein each of said first and second actuators comprises a plurality of actuators.

30. The apparatus according to claim 29, wherein said plurality of electromagnetic linear motors or coils of said electromagnetic linear motors are formed into several groups, and a plurality of electromagnetic linear motors or coils of said electromagnetic linear motors which are included in the same group are driven by the same driving signal.

31. The apparatus according to claim 30, wherein said electromagnetic linear motors or coils of said electromagnetic linear motors driven by the same driving signal are electrically connected in series or parallel.

32. The apparatus according to claim 12, wherein signals representing motion modes of translation and rotation are extracted from a displacement target value and output signals from said plurality of displacement detection means, and the extracted signals are compensated for to drive at least one of sets of said first actuators and said second actuators.

33. The apparatus according to claim 13, wherein signals representing motion modes of translation and rotation are extracted from output signals from said plurality of vibration detection means, and the extracted signals are compensated for to drive at least one of sets of said first actuators and said second actuators.

34. The apparatus according to claim 1, wherein said apparatus further comprises first feedforward compensation operation means for performing a compensation operation on the basis of a state of a device mounted on the anti-vibration apparatus or a signal from the device, and drives said first actuator on the basis of a compensated signal obtained by a first feedforward compensation operation.

35. The apparatus according to claim 1, wherein said apparatus further comprises second feedforward compensation operation means for performing a compensation operation on the basis of a state of a device mounted on the anti-vibration apparatus or a signal from the device, and drives said second actuator on the basis of a compensated signal obtained by said second feedforward compensation operation means.

36. An exposure apparatus comprising anti-vibration means using said anti-vibration apparatus defined in claims 1–35.

37. The apparatus according to claim 36, wherein said anti-vibration means supports a stage base plate and removes vibrations of the stage base plate.

38. The apparatus according to claim 36, wherein said anti-vibration means supports a lens barrel base plate and removes vibrations of the lens barrel base plate.

39. The apparatus according to claim 36, wherein a reticle base plate for supporting a reticle stage is coupled to a lens barrel base plate, and said anti-vibration means supports the lens barrel base plate and removes vibrations of the reticle stage.

40. The apparatus according to claim 36, wherein said exposure apparatus is a scan type exposure apparatus.

41. A method of manufacturing a device by using said exposure apparatus defined in claim 36, comprising the steps of providing said exposure apparatus defined in claim 36, and transferring a pattern formed on a reticle onto a wafer.

42. The method according to claim 41, further comprising the steps of coating with a photoresist on the wafer, and developing a portion exposed on the wafer.

43. An anti-vibration method comprising the steps of:
    detecting a displacement or vibration of a damped/supported object, extracting signals representing motion modes of translation and rotation from the detection values, and performing a compensation operation on the basis of the signals; and
    controlling, based on resulting motion mode compensated signals, at least one of a first actuator for generating forces in vertical and horizontal directions and a second actuator which generates a force in at least one of the vertical and horizontal directions and is driven on a driving principle different from a driving principle of said first actuator.

44. An anti-vibration method comprising the steps of:

performing a feedforward compensation operation on the basis of a state of a device mounted on an anti-vibration apparatus or a signal from the device; and controlling, based on resulting feedforward compensated signals, at least one of a first actuator for generating forces in vertical and horizontal directions and a second actuator which generates a force in at least one of the vertical and horizontal directions and is driven on a driving principle different from a driving principle of said first actuator.

* * * * *

UNITED STATES PATENT AND TRADEMARK OFFICE
CERTIFICATE OF CORRECTION

PATENT NO. : 6,322,060 B1  Page 1 of 1
DATED : November 27, 2001
INVENTOR(S) : Takehiko Mayama et al.

It is certified that error appears in the above-identified patent and that said Letters Patent is hereby corrected as shown below:

Column 1,
Line 27, "floor" should read -- floor on --.

Column 7,
Line 26, "adisplacement" should read -- a displacement --.

Column 12,
Line 10, "anit-vibrationunit." should read -- anti-vibration unit. --.

Column 18,
Line 25, "Furthermore," should read -- ¶ Furthermore, --.

Column 20,
Line 47, "band" should read -- b and --.

Column 23,
Line 21, "(wafermanufacture)," should read -- (wafer manufacture), --.
Line 23, "(waferprocess)," should read -- (wafer process), --.

Column 24,
Line 8, "implimented" should read -- implemented --.

Signed and Sealed this

Second Day of April, 2002

Attest:

Attesting Officer

JAMES E. ROGAN
Director of the United States Patent and Trademark Office